(12) United States Patent
Feng et al.

(10) Patent No.: US 11,120,746 B2
(45) Date of Patent: Sep. 14, 2021

(54) SHIFT REGISTER UNIT, GATE DRIVING CIRCUIT, DISPLAY DEVICE AND DRIVING METHOD

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/965,124

(22) PCT Filed: Jan. 19, 2020

(86) PCT No.: PCT/CN2020/073027
§ 371 (c)(1),
(2) Date: Jul. 27, 2020

(87) PCT Pub. No.: WO2020/168887
PCT Pub. Date: Aug. 27, 2020

(65) Prior Publication Data
US 2021/0201809 A1 Jul. 1, 2021

(30) Foreign Application Priority Data
Feb. 22, 2019 (CN) .......................... 201910133087.2

(51) Int. Cl.
*G09G 3/3266* (2016.01)
*G09G 3/3225* (2016.01)
*G11C 19/28* (2006.01)

(52) U.S. Cl.
CPC ......... *G09G 3/3266* (2013.01); *G09G 3/3225* (2013.01); *G11C 19/28* (2013.01);
(Continued)

(58) Field of Classification Search
None
See application file for complete search history.

(56) References Cited

U.S. PATENT DOCUMENTS 9,965,985 B2  5/2018  Wang
2016/0232852 A1  8/2016  An et al.
(Continued)

FOREIGN PATENT DOCUMENTS

CN  105118417 A  12/2015
CN  105609040 A  5/2016
(Continued)

OTHER PUBLICATIONS

First Chinese Office Action from Chinese Patent Application No. 201910133087.2 dated Jun. 22, 2021.

*Primary Examiner* — Christopher J Kohlman
(74) *Attorney, Agent, or Firm* — Dilworth & Barrese, LLP.; Michael J. Musella, Esq.

(57) ABSTRACT

A shift register unit, a gate driving circuit, a display device and a driving method are provided. The shift register unit includes a first input circuit, an output circuit, a first control circuit, a first reset circuit, a second input circuit, a transmission circuit, and a storage circuit. The first input circuit is configured to control a level of a first node, the output circuit is configured to provide an output signal at an output terminal, the first control circuit is configured to control a level of a second node under control of the level of the first node, the first reset circuit is configured to reset the first node and the output terminal under control of the level of the second node, and the storage circuit is electrically connected
(Continued)

to the second node, and is configured to stabilize the level of the second node.

20 Claims, 11 Drawing Sheets

(52) U.S. Cl.
CPC .............. *G09G 2300/0426* (2013.01); *G09G 2310/0286* (2013.01); *G09G 2310/061* (2013.01); *G09G 2310/08* (2013.01); *G09G 2320/0233* (2013.01)

(56) References Cited

U.S. PATENT DOCUMENTS

| | | | |
|---|---|---|---|
| 2017/0124936 A1 | 5/2017 | Tseng | |
| 2020/0135286 A1* | 4/2020 | Li | ........................ G09G 3/3677 |
| 2021/0201804 A1 | 7/2021 | Feng et al. | |

FOREIGN PATENT DOCUMENTS

| | | |
|---|---|---|
| CN | 108520724 A | 9/2018 |
| CN | 108648716 A | 10/2018 |
| CN | 108735142 A | 11/2018 |
| CN | 109166527 A | 1/2019 |
| CN | 109192171 A | 1/2019 |
| CN | 109935211 A | 6/2019 |

* cited by examiner

SHIFT REGISTER UNIT, GATE DRIVING CIRCUIT, DISPLAY DEVICE AND DRIVING METHOD

CROSS-REFERENCE TO RELATED APPLICATION

The present application claims priority to Chinese Patent Application No. 201910133087.2, filed on Feb. 22, 2019, the disclosure of which is incorporated herein by reference in its entirety as part of the present application.

TECHNICAL FIELD

The embodiments of the present disclosure relate to a shift register unit, a gate driving circuit, a display device, and a driving method.

BACKGROUND

In the display field, especially in OLED (Organic Light-Emitting Diode) display panels, gate driving circuits are generally integrated in gate driving chips (GATE ICs) currently. In the design of integrated circuits (ICs), the area of a chip is a main factor that affects the cost of the chip, so how to effectively reduce the area of the chip is what technology developers need to focus on.

SUMMARY

At least one embodiment of the present disclosure provides a shift register unit comprising a first input circuit, an output circuit, a first control circuit, a first reset circuit, a second input circuit, a transmission circuit, and a storage circuit. The first input circuit is configured to control a level of a first node in response to a first input signal, the output circuit is configured to provide an output signal at an output terminal under control of the level of the first node, the first control circuit is configured to control a level of a second node under control of the level of the first node, the first reset circuit is configured to reset the first node and the output terminal under control of the level of the second node, the second input circuit is configured to control a level of a third node in response to a selection control signal, the transmission circuit is configured to control the level of the first node according to the level of the third node, and the storage circuit is electrically connected to the second node, and is configured to stabilize the level of the second node.

For example, in the shift register unit provided by some embodiments of the present disclosure, the second input circuit comprises a selection input circuit and a transmission control circuit. The selection input circuit is configured to control, in response to the selection control signal, a level of a fourth node by using a second input signal; and the transmission control circuit is connected to the third node and the fourth node, and is configured to transmit a first clock signal to the third node under control of the level of the fourth node.

For example, the shift register unit provided by some embodiments of the present disclosure further comprises a second reset circuit, and the second reset circuit is configured to reset the third node under control of the level of the second node.

For example, in the shift register unit provided by some embodiments of the present disclosure, the second reset circuit is connected to the second node and the third node.

For example, in the shift register unit provided by some embodiments of the present disclosure, the storage circuit comprises a first capacitor, the selection input circuit comprises a first transistor, and the transmission control circuit comprises a second transistor, and the transmission circuit comprises a fourth transistor; a first electrode of the first capacitor is connected to the fourth node, and a second electrode of the first capacitor is connected to the second node; a gate electrode of the first transistor is configured to receive the selection control signal, a first electrode of the first transistor is configured to receive the second input signal, and a second electrode of the first transistor is connected to the fourth node; a gate electrode of the second transistor is connected to the fourth node, a first electrode of the second transistor is configured to receive the first clock signal, and a second electrode of the second transistor is connected to the third node; and a gate electrode of the fourth transistor is configured to receive the first clock signal, a first electrode of the fourth transistor is connected to the third node, and a second electrode of the fourth transistor is connected to the first node.

For example, in the shift register unit provided by some embodiments of the present disclosure, the storage circuit comprises a first capacitor, the selection input circuit comprises a first transistor, the transmission control circuit comprises a second transistor, the second reset circuit comprises a third transistor, and the transmission circuit comprises a fourth transistor; a first electrode of the first capacitor is connected to the fourth node, and a second electrode of the first capacitor is connected to the second node; a gate electrode of the first transistor is configured to receive the selection control signal, a first electrode of the first transistor is configured to receive the second input signal, and a second electrode of the first transistor is connected to the fourth node; a gate electrode of the second transistor is connected to the fourth node, a first electrode of the second transistor is configured to receive the first clock signal, and a second electrode of the second transistor is connected to the third node; a gate electrode of the third transistor is connected to the second node, a first electrode of the third transistor is connected to the third node, and a second electrode of the third transistor is configured to receive a first voltage; and a gate electrode of the fourth transistor is connected to the third node, a first electrode of the fourth transistor is configured to receive the first clock signal or a second voltage, and a second electrode of the fourth transistor is connected to the first node.

For example, in the shift register unit provided by some embodiments of the present disclosure, the storage circuit comprises a second capacitor, the selection input circuit comprises a first transistor and a first capacitor, the transmission control circuit comprises a second transistor, the second reset circuit comprises a third transistor, and the transmission circuit comprises a fourth transistor; a first electrode of the second capacitor is connected to the second node, and a second electrode of the second capacitor is configured to receive a fixed level; a gate electrode of the first transistor is configured to receive the selection control signal, a first electrode of the first transistor is configured to receive the second input signal, and a second electrode of the first transistor is connected to the fourth node; a first electrode of the first capacitor is connected to the fourth node, and a second electrode of the first capacitor is connected to the third node; a gate electrode of the second transistor is connected to the fourth node, a first electrode of the second transistor is configured to receive the first clock signal, and a second electrode of the second transistor is connected to the third node; a gate electrode of the third transistor is connected to the second node, a first electrode of the third transistor is connected to the third node, and a second electrode of the third transistor is configured to receive a first voltage; and a gate electrode of the fourth transistor is connected to the third node, a first electrode of the fourth transistor is configured to receive the first clock signal or a second voltage, and a second electrode of the fourth transistor is connected to the first node.

For example, in the shift register unit provided by some embodiments of the present disclosure, the first control circuit is further configured to transmit a second voltage to the second node under control of a second clock signal; the output circuit is further configured to receive a third clock signal and provide the third clock signal to the output terminal as the output signal under control of the level of the first node; both the second clock signal and the third clock signal are pulse signals with a duty ratio of one-third, the third clock signal and the second clock signal are separated in timing by a first time interval, and the first time interval is equal to two thirds of a period of the pulse signal.

For example, in the shift register unit provided by some embodiments of the present disclosure, the first input circuit comprises a fifth transistor, the first control circuit comprises a sixth transistor and a seventh transistor, the output circuit comprises an eighth transistor, a ninth transistor, and a third capacitor, the output terminal comprises a shifting signal output terminal and a driving signal output terminal, and the shifting signal output terminal and the driving signal output terminal are configured to output the output signal; a gate electrode of the fifth transistor is configured to receive the first input signal, a first electrode of the fifth transistor is configured to receive the first input signal or the second voltage, and a second electrode of the fifth transistor is connected to the first node; a gate electrode of the sixth transistor is configured to receive the second clock signal, a first electrode of the sixth transistor is configured to receive the second voltage, and a second electrode of the sixth transistor is connected to the second node; a gate electrode of the seventh transistor is connected to the first node, a first electrode of the seventh transistor is connected to the second node, and a second electrode of the seventh transistor is configured to receive a first voltage; a gate electrode of the eighth transistor is connected to the first node, a first electrode of the eighth transistor is configured to receive the third clock signal, and a second electrode of the eighth transistor is connected to the shifting signal output terminal; a gate electrode of the ninth transistor is connected to the first node, a first electrode of the ninth transistor is configured to receive the third clock signal, and a second electrode of the ninth transistor is connected to the driving signal output terminal; and a first electrode of the third capacitor is connected to the first node, and a second electrode of the third capacitor is connected to the driving signal output terminal.

For example, the shift register unit provided by some embodiments of the present disclosure further comprises a second control circuit, and the second control circuit is configured to control the level of the second node under control of the first clock signal and the level of the fourth node.

For example, in the shift register unit provided by some embodiments of the present disclosure, the second control circuit comprises a tenth transistor and an eleventh transistor. A gate electrode of the tenth transistor is configured to receive the first clock signal, a first electrode of the tenth transistor is connected to the second node, and a second electrode of the tenth transistor is connected to a first electrode of the eleventh transistor, a gate electrode of the eleventh transistor is connected to the fourth node, and a second electrode of the eleventh transistor is configured to receive a first voltage.

For example, the shift register unit provided by some embodiments of the present disclosure further comprises a third control circuit, and the third control circuit is configured to control the level of the second node in response to the first input signal.

For example, in the shift register unit provided by some embodiments of the present disclosure, the third control circuit comprises a twelfth transistor, a gate electrode of the twelfth transistor is configured to receive the first input signal, a first electrode of the twelfth transistor is connected to the second node, and a second electrode of the twelfth transistor is configured to receive a first voltage.

For example, the shift register unit provided by some embodiments of the present disclosure further comprises a third reset circuit and a fourth reset circuit, and the third reset circuit is configured to reset the first node in response to a display reset signal, and the fourth reset circuit is configured to reset the first node in response to a global reset signal.

For example, in the shift register unit provided by some embodiments of the present disclosure, the third reset circuit comprises a thirteenth transistor, and the fourth reset circuit comprises a fourteenth transistor; a gate electrode of the thirteenth transistor is configured to receive the display reset signal, a first electrode of the thirteenth transistor is connected to the first node, and a second electrode of the thirteenth transistor is configured to receive a first voltage; and a gate electrode of the fourteenth transistor is configured to receive the global reset signal, a first electrode of the fourteenth transistor is connected to the first node, and a second electrode of the fourteenth transistor is configured to receive the first voltage.

At least one embodiment of the present disclosure further provides a gate driving circuit comprising a plurality of shift register units, which are cascaded, provided by the embodiments of the present disclosure.

For example, the gate driving circuit provided by some embodiments of the present disclosure further comprises a first sub-clock signal line, a second sub-clock signal line, and a third sub-clock signal line; a shift register unit of a (3n−2)-th stage is connected to the first sub-clock signal line to receive a second clock signal for the shift register unit of the (3n−2)-th stage, and the shift register unit of the (3n−2)-th stage is connected to the third sub-clock signal line to receive a third clock signal for the shift register (3n−2)-th stage unit; a shift register unit of a (3n−1)-th stage is connected to the second sub-clock signal line to receive a second clock signal for the shift register unit of the (3n−1)-th stage, and the shift register unit of the (3n−1)-th stage is connected to the first sub-clock signal line to receive a third clock signal for the shift register unit of the (3n−1)-th stage; a shift register unit of a (3n)-th stage is connected to the third sub-clock signal line to receive a second clock signal for the shift register unit of the (3n)-th stage, and the shift register unit of the (3n)-th stage is connected to the second sub-clock signal line receive a third clock signal for the shift register unit of the (3n)-th stage; and n is an integer greater than 0.

At least one embodiment of the present disclosure further provides a display device comprising the gate driving circuit provided by the embodiment of the present disclosure.

At least one embodiment of the present disclosure further provides a method of driving the shift register unit provided by an embodiment of the present disclosure, the method comprises: controlling, by the first input circuit, the level of the first node in response to the first input signal; providing, by the output circuit, the output signal at the output terminal under the control of the level of the first node; controlling, by the first control circuit, the level of the second node under the control of the level of the first node; resetting, by the first reset circuit, the first node and the output terminal under the control of the level of the second node; controlling, by the second input circuit, the level of the third node in response to the selection control signal; controlling, by the transmission circuit, the level of the first node according to the level of the third node; and stabilizing, by the storage circuit, the level of the second node.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
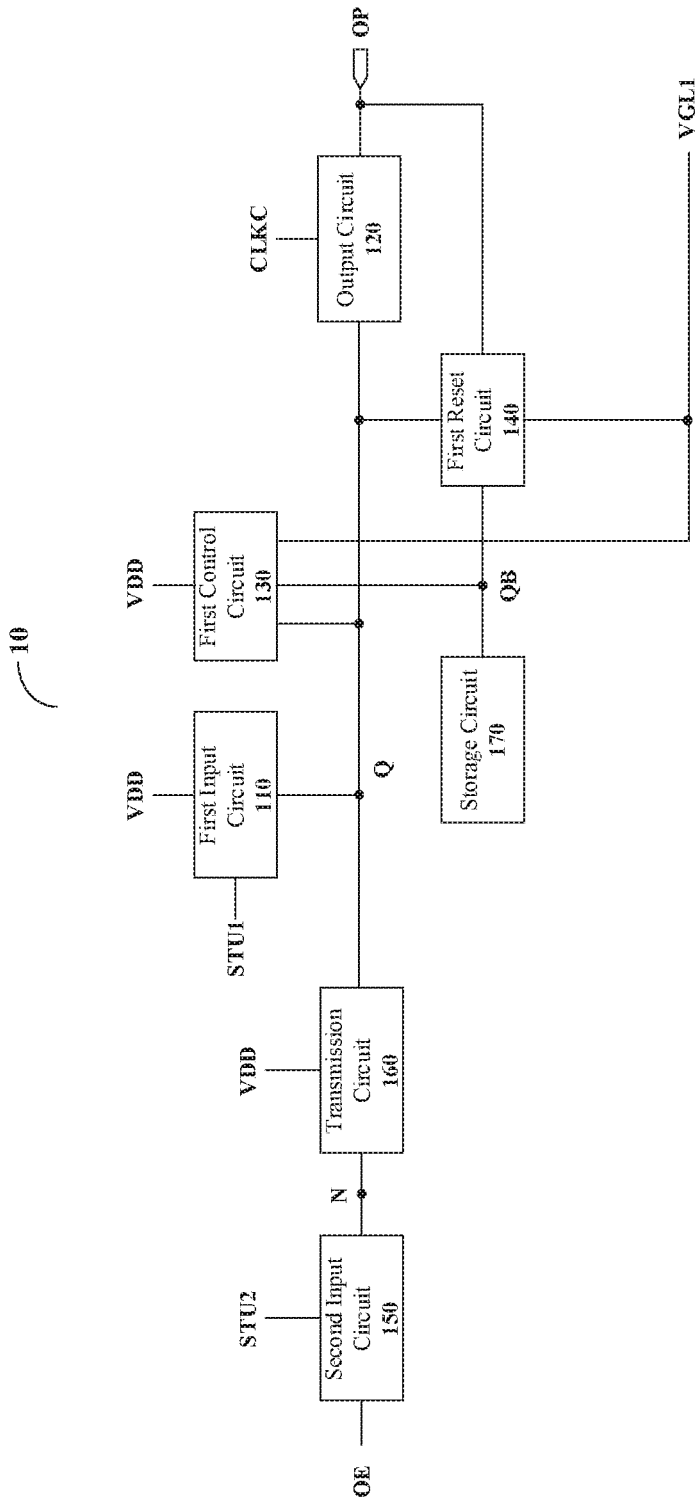
FIG. 1 is a schematic diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the present disclosure, for example, in the case where each circuit is implemented as N-type transistors, the term "pull up" means to charge a node or an electrode of a transistor to increase the absolute value of the level of the node or the electrode, so as to achieve the operation (for example, turning on) of the corresponding transistor; and the term "pull down" means to discharge a node or an electrode of a transistor to reduce the absolute value of the level of the node or the electrode, so as to achieve the operation (for example, turning off) of the corresponding transistor.

For another example, in the case where each circuit is implemented as P-type transistors, the term "pull up" means to discharge a node or an electrode of a transistor to reduce the absolute value of the level of the node or the electrode, so as to achieve the operation (for example, turning on) of the corresponding transistor; and the term "pull down" means to charge a node or an electrode of a transistor to increase the absolute value of the level of the node or the electrode, so as to achieve the operation (for example, turning off) of the corresponding transistor.

At present, a gate driving circuit for an OLED usually includes three sub-circuits, i.e., a detection circuit, a display circuit, and a connection circuit (or a gate circuit) that outputs a composite pulse of the detection circuit and the display circuit. Such circuit structure is very complicated and cannot meet requirements of a high resolution and a narrow bezel of a display panel.

When compensating for a sub-pixel unit in an OLED display panel, in addition to performing internal compensation by providing a pixel compensation circuit in the sub-pixel unit, external compensation can also be performed by providing a sensing transistor. When performing external compensation, a gate driving circuit including shift register units needs to provide driving signals for a scanning transistor and a sensing transistor respectively to the sub-pixel unit in the display panel, for example, a scanning driving signal for the scanning transistor in a display period of a frame and a sensing driving signal for the sensing transistor in a blanking period of a frame.

In an external compensation method, the sensing driving signal output by the gate driving circuit is used for progressive sequential scanning. For example, during a blanking period of a first frame, a sensing driving signal for a first row of sub-pixel units in the display panel is output, and during a blanking period of a second frame, a sensing driving signal for a second row of sub-pixel units in the display panel is output, and so on. The sensing driving signals are sequentially outputted row by row at a frequency which is outputting the sensing driving signal of a corresponding row of sub-pixel units during each frame, and thus the progressive sequential compensation of the display panel is completed.

However, in the case where the above progressive compensation method is adopted, there may be a problem of a poor display effect: first, there is a scanning line that moves row by row during the process of the multi-frame scanning display; second, a difference between time points of performing external compensation will cause a large difference between brightness in different regions of the display panel, for example, when performing external compensation on the 100-th row of sub-pixel units in the display pane, although external compensation has been performed on the 10-th row of sub-pixel units in the display panel, the light-emitting brightness of the 10-th row of sub-pixel units may have changed, for example, the light-emitting brightness is reduced, which may cause uneven brightness in different regions of the display panel. This problem will be more obvious in large-scale display panels.

As described above, when a gate driving circuit drives a display panel, if external compensation is to be realized, the gate driving circuit needs to not only output the scanning driving signal for the display period, but also output the sensing driving signal for the blanking period.

In addition, for example, in the case where a shift register unit is required to output a driving signal, a level of a control terminal (for example, connected to a first node) of a output circuit in the shift register unit needs to be maintained at a high level; for another example, in the case where the shift register unit is not required to output the driving signal, a level of the first node needs to be maintained at a low level; in other words, the level of the first node directly affects the output of the shift register unit, the level of the first node should be stably maintained at a low level in a non-output stage, otherwise the shift register unit may output signals multiple times within a frame.

In order to control the level of the first node better, a control circuit and a reset circuit are generally provided in the shift register unit. For example, the control circuit is configured to control a level of a second node, and the reset circuit is configured to control the level of the first node under the control of the level of the second node. For example, in the non-output stage, in order to ensure that the level of the first node is stabilized at a low level, the level of the second node needs to be maintained at a high level. In the non-output stage, if the level of the second node fails to be maintained at a high level, it may cause the level of the first node to drift, thereby affecting the normal output of the shift register unit.

At least one embodiment of the present disclosure provides a shift register unit including a first input circuit, an output circuit, a first control circuit, a first reset circuit, a second input circuit, a transmission circuit, and a storage circuit. The first input circuit is configured to control a level of a first node in response to a first input signal, the output circuit is configured to provide an output signal at an output terminal under the control of the level of the first node, the first control circuit is configured to control a level of a second node under the control of the level of the first node, the first reset circuit is configured to reset the first node and the output terminal under the control of the level of the second node, the second input circuit is configured to control a level of a third node in response to a selection control signal, the transmission circuit is configured to control the level of the first node according to the level of the third node, and the storage circuit is electrically connected to the second node, and is configured to stabilize the level of the second node.

Embodiments of the present disclosure also provide a gate driving circuit, a display device, and a driving method corresponding to the above shift register unit.

The shift register unit, the gate driving circuit, the display device, and the driving method provided by the embodiments of the present disclosure can better stabilize the level of the second node in the shift register unit. For example, in a stage where the shift register unit does not need to output a driving signal (an non-output stage), the second node can be stably maintained at a high level, so that the level of the first node does not drift and is stably maintained at a low level, thereby preventing the shift register unit from outputting signals multiple times. In this case, the corresponding gate driving circuit and the display device can also realize random compensation, thereby avoiding the problems of poor display effects such as scanning lines and uneven display brightness caused by the progressive sequential compensation.

It should be noted that, in the embodiments of the present disclosure, the random compensation refers to an external compensation method that is different from the progressive sequential compensation, which can randomly output a sensing driving signal corresponding to any row of sub-pixel units in the display panel during a blanking period of a frame. The same explanation also applies to following embodiments, and will not be described in detail.

In addition, in the embodiments of the present disclosure, for the purpose of illustration, "a frame," "each frame," or "a certain frame" is defined to include a display period and a blanking period sequentially occur, for example, during the display period, the gate driving circuit outputs a driving signal, which can drive the display panel to complete the scanning display of a whole image from the first row to the last row, and during the blanking period, the gate driving circuit outputs a driving signal, which can be used to drive a sensing transistor in a row of sub-pixel units in the display panel to complete external compensation of the row of sub-pixel units.

Figure 2:
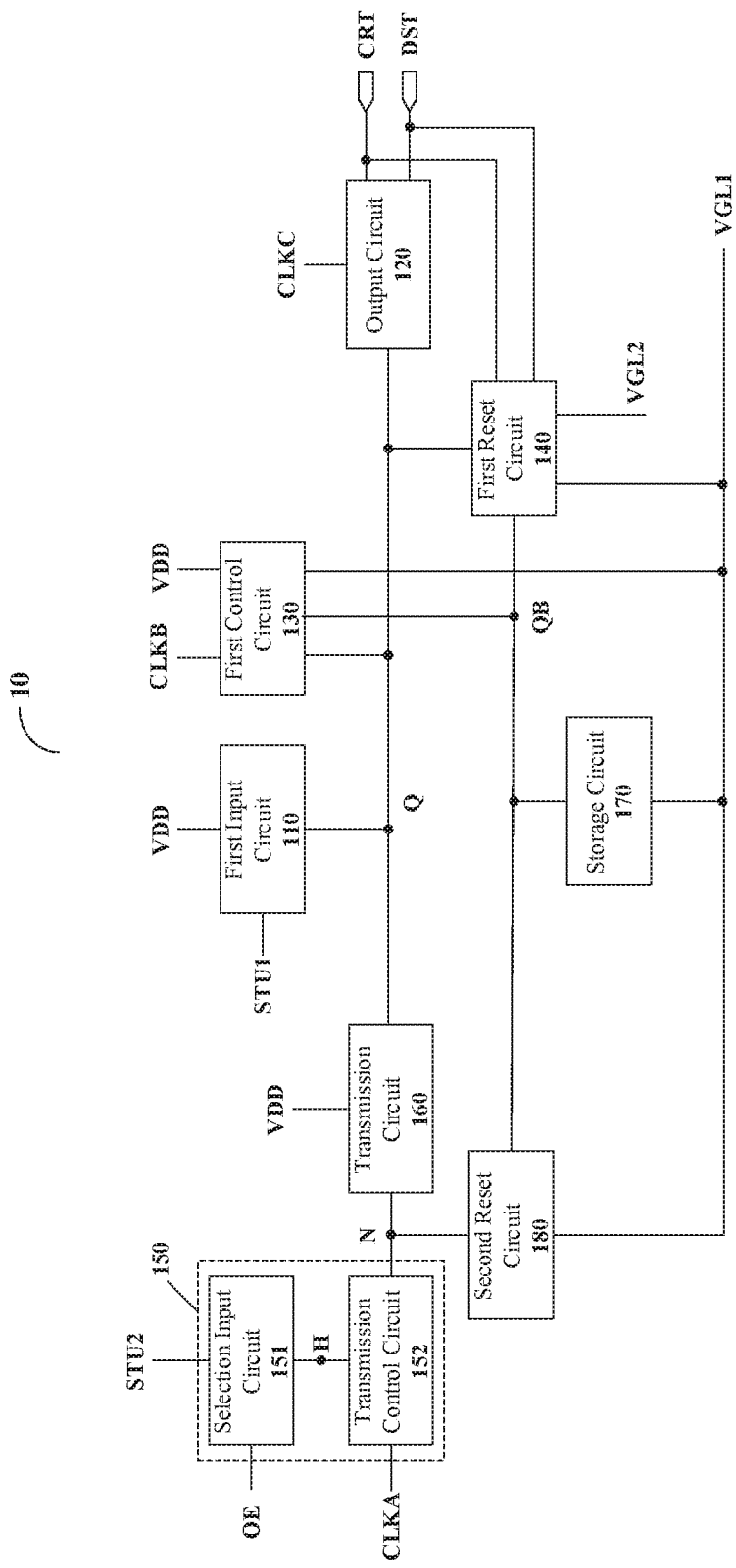
FIG. 2 is a schematic diagram of another shift register unit provided by some embodiments of the present disclosure.

The embodiments of the present disclosure and examples thereof will be described in detail below with reference to the drawings. FIG. 1 is a schematic diagram of a shift register unit provided by some embodiments of the present disclosure; and FIG. 2 is a schematic diagram of another shift register unit provided by some embodiments of the present disclosure.

At least one embodiment of the present disclosure provides a shift register unit 10. As shown in FIG. 1, the shift register unit 10 includes a first input circuit 110, an output circuit 120, a first control circuit 130, and a first reset circuit 140, a second input circuit 150, a transmission circuit 160, and a storage circuit 170. A plurality of the shift register units 10 can be cascaded to construct a gate driving circuit provided by an embodiment of the present disclosure, and the gate driving circuit can be used in a display device to provide a driving signal during the displaying process of a frame of the display device.

The first input circuit 110 is configured to control a level of a first node Q in response to a first input signal STU1, for example, to charge the first node Q. For example, the first input circuit 110 may be configured to receive the first input signal STU1 and a second voltage VDD, and the first input circuit 110 is turned on in response to the first input signal STU1, so that the first node Q1 can be charged with the second voltage VDD. For another example, the first input circuit 110 may also not receive the second voltage VDD, and directly charges the first node Q1 with the first input signal STU1.

It should be noted that, in some embodiments of the present disclosure, the second voltage VDD is, for example, a high level. The same case also applies to the following embodiments, and will not be repeated.

The output circuit 120 is configured to provide an output signal at an output terminal OP under the control of the level of the first node Q. For example, as shown in FIG. 2, in some embodiments, the output terminal OP includes a shifting signal output terminal CRT and a driving signal output terminal DST, and accordingly, the output signals include a shifting signal CR and a driving signal OUT. For example, the output circuit 120 may be configured to receive a third clock signal CLKC, and when being turned on under the control of the level of the first node Q, the output circuit 120 may provide the third clock signal CLKC to the shifting signal output terminal CRT as the shifting signal CR, and provide the third clock signal CLKC to the driving signal output terminal DST as the driving signal OUT.

For example, during a display period of a frame, the shifting signal CR output by the output circuit 120 may be provided to other shift register units 10 as the first input signal STU1, thereby completing the progressive shift of the display scan; the driving signal OUT output by the output circuit 120 can drive a row of sub-pixel units in the display panel to perform the display scan.

For example, in the case where a plurality of shift register units 10 are cascaded to form a gate driving circuit, some of the shift register units 10 can be connected to a clock signal line to receive the first input signals STU1 provided by the clock signal line; alternatively, some of shift register units 10 may also receive the shifting signals CR output by other shift register units 10 as the first input signals STU1.

It should be noted that, during the display period of the frame, the signal waveforms of the shifting signal CR and the driving signal OUT output by the output circuit 120 may be the same or different, which is not limited in the embodiments of the present disclosure.

The first control circuit 130 is configured to control a level of a second node QB under the control of the level of the first node Q. For example, the first control circuit 130 is connected to the first node Q and the second node QB, and is configured to receive a first voltage VGL1 and the second voltage VDD. For example, in the case where the first node Q is at a high level, the first control circuit 130 may pull down the second node QB to a low level with the first voltage VGL1 at a low level. For another example, in some embodiments, as shown in FIG. 2, the first control circuit 130 is configured to receive a second clock signal CLKB, and in the case where the first node Q is at a low level and the second clock signal CLKB is at a high level, the first control circuit 130 can be turned on in response to the second clock signal CLKB at a high level, so that the second node QB can be charged with the second voltage VDD at a high level to pull up the second node QB to a high level.

It should be noted that, in some embodiments of the present disclosure, the first voltage VGL1 is, for example, a low level. The following embodiments are the same as this, and will not be described in detail.

The first reset circuit 140 is configured to reset the first node Q and the output terminal OP (for example, including the shifting signal output terminal CRT and the driving signal output terminal DST) under the control of the level of the second node QB. For example, as shown in FIG. 1, the first reset circuit 140 is connected to the first node Q, the second node QB, and the output terminal OP, and is configured to receive the first voltage VGL1 at a low level. For example, when being turned on under the control of the level of the second node QB, the first reset circuit 140 may pull down and reset the first node Q and the output terminal OP with the first voltage VGL1 at a low level.

For another example, in some embodiments, as shown in FIG. 2, in the case where the output terminal OP includes the shifting signal output terminal CRT and the driving signal output terminal DST, the first reset circuit 140 may also be configured to receive a third voltage VGL2 at a low level. When being turned on under the control of the level of the second node QB, the first reset circuit 140 may pull down and reset the first node Q and the shifting signal output terminal CRT with the first voltage VGL1 at a low level, and also pull down and reset the driving signal output terminal DST with the third voltage VGL2 at a low level.

It should be noted that, in some embodiments of the present disclosure, the driving signal output terminal DST may also be pulled down and reset by using the first voltage VGL1, which is not limited in the present disclosure. In addition, in the embodiment of the present disclosure, the third voltage VGL2 is, for example, a low level, and the third voltage VGL2 may be the same as or different from the first voltage VGL1. The same case applies to the following embodiments, and will not be repeated.

In order to achieve random compensation, as shown in FIG. 1, in some embodiments of the present disclosure, the shift register unit 10 includes a second input circuit 150 and a transmission circuit 160.

The second input circuit 150 is configured to control a level of a third node N in response to a selection control signal OE. For example, as shown in FIG. 2, in some embodiments of the present disclosure, the second input circuit 150 includes a selection input circuit 151 and a transmission control circuit 152.

The selection input circuit 151 is configured to control a level of a fourth node H by using a second input signal STU2 in response to the selection control signal OE, for example, to charge the fourth node H and maintain the level of the fourth node H. For example, in a display period of a frame, the selection input circuit 151 may be turned on under the control of the selection control signal OE, so that the fourth node H can be charged with the second input signal STU2. The level (e.g., high level) of the fourth node H may be maintained from the display period of a frame to the blanking period of the frame.

The transmission control circuit 152 is connected to the third node N and the fourth node H, and is configured to transmit a first clock signal CLKA to the third node N under the control of the level of the fourth node H. For example, in some embodiments, the transmission control circuit 152 may be configured to receive the first clock signal CLKA, and may transmit the first clock signal CLKA to the third node N when the transmission control circuit 152 is turned on under the control of the level of the fourth node H, thereby controlling the level of the third node N. For example, in a blanking period of a frame, when the first clock signal CLKA is at a high level, the transmission control circuit 152 may transmit the high level to the third node N, so that the third node N is at a high level.

The transmission circuit 160 is configured to control the level of the first node Q according to the level of the third node N, for example, to charge the first node Q. For example, the transmission circuit 160 is connected to the first node Q and the third node N, and is configured to receive the second voltage VDD. For example, when being turned on under the control of the level of the third node N, the transmission circuit 160 may charge the first node Q with the second voltage VDD at a high level. For another example, in some embodiments, the transmission circuit 160 may be configured to receive the first clock signal CLKA. As described above, in the case where the first clock signal CLKA is at a high level, the transmission control circuit 152 causes the third node N to be at a high level. In this case, the transmission circuit 160 is turned on under the control of the first clock signal CLKA, so that the high level of the third node N can be transmitted to the first node Q, thereby controlling the level of the first node Q, for example, charging the first node Q.

For example, in the case where a plurality of shift register units 10 are cascaded to form a gate driving circuit, a shift register unit 10 of a certain stage may receive the shifting signal CR output by this shift register unit 10 as the second input signal STU2; alternatively, a shift register unit 10 of a certain stage may also receive the shifting signal CR output by a shift register unit 10 of another stage as the second input signal STU2.

For example, in the case where it is necessary to select a certain shift register unit 10 to output a driving signal in a blanking period of a frame, when this shift register unit 10 outputs a shifting signal CR in the display period of the frame, the shifting signal CR may be provided to the selection input circuit 151 in the stage shift register unit 10 as the second input signal STU2, and the waveform timings of the selection control signal OE and the shifting signal CR supplied to the shift register unit 10 of the stage are the same, so that the selection input circuit 151 in this shift register unit 10 is turned on. Because the selection input circuit 151 is turned on, the fourth node H can be charged with the second input signal STU2 to pull up the level of the fourth node H. Then, the high level of the fourth node H may be maintained from the display period of the frame to the blanking period of the frame.

In the blanking period of the frame, the first clock signal CLKA provided to the transmission control circuit 152 in this shift register unit 10 may be at a high level, and the transmission control circuit 152 is turned on under the control of the high level of the fourth node H, so that the first clock signal CLKA at a high level can be transmitted to the third node N, therefore the level of the third node N becomes a high level. The transmission circuit 160 in this shift register unit 10 is turned on under the control of the high level of the third node N, so that the first node Q can be charged with the second voltage VDD at a high level to pull up the level of the first node Q. The output circuit 120 in this shift register unit 10 is turned on under the control of the high level of the first node Q, and thus can provide an output signal at an output terminal, for example, a driving signal OUT at a driving signal output terminal DST. For example, the driving signal OUT may be used to drive sensing transistors in a row of sub-pixel units in the display panel to complete external compensation of the row of sub-pixel units.

The storage circuit 170 is electrically connected to the second node QB, and is configured to stabilize the level of the second node QB. For example, in some embodiments, the storage circuit 170 may include a capacitor. For example, a first electrode of the capacitor is connected to the second node QB, and a second electrode of the capacitor may be configured to receive a fixed level, so that the capacitor can stabilize the level of the second node QB. For example, in the case where the shift register unit 10 does not need to output a driving signal, the storage circuit 170 can stably maintain the second node QB at a high level, so that the level of the first node Q does not drift and is stably maintained at a low level, thereby avoiding the problem that the shift register unit 10 outputs signals multiple times.

For example, as shown in FIG. 2, in some embodiments, the storage circuit 170 may be configured to receive the first voltage VGL1. For example, in the case where the storage circuit 170 includes a capacitor, a first electrode of the capacitor may receive the first voltage VGL1.

Figure 3:
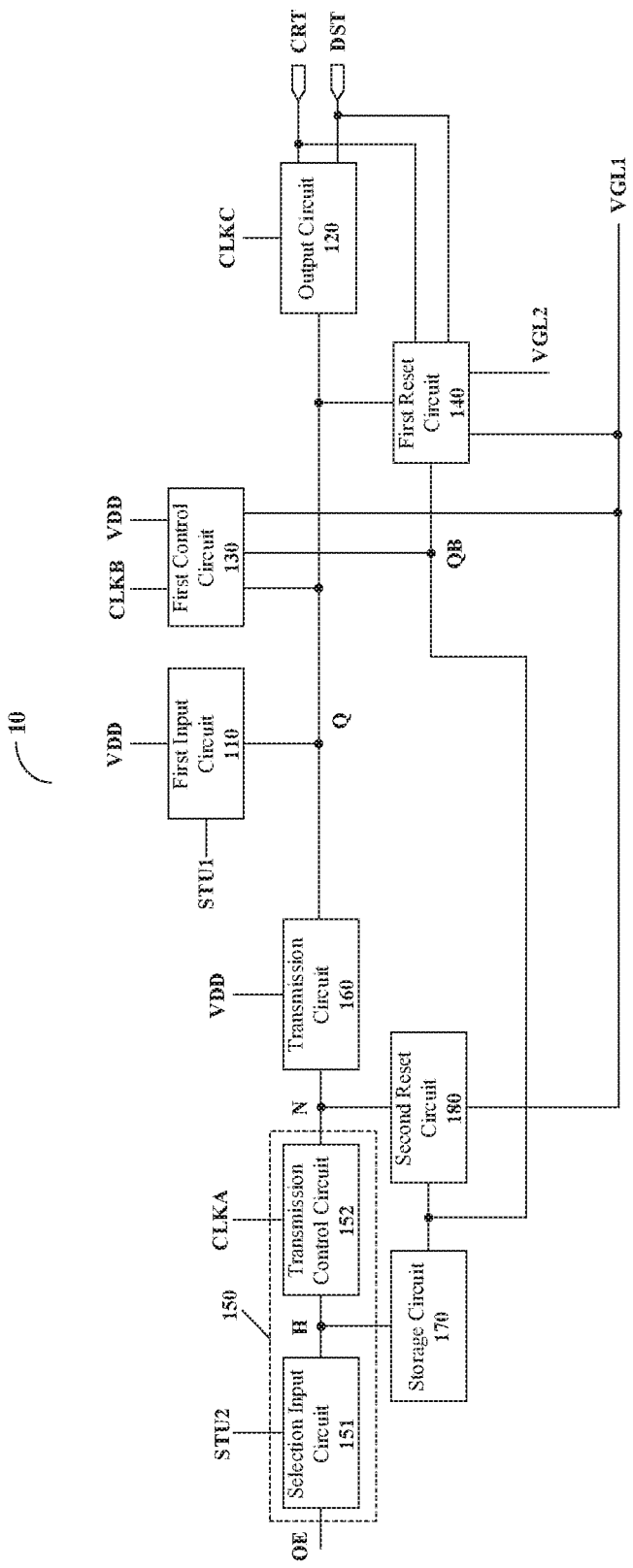
FIG. 3 is a schematic diagram of yet another shift register unit provided by some embodiments of the present disclosure.
Figure 4:
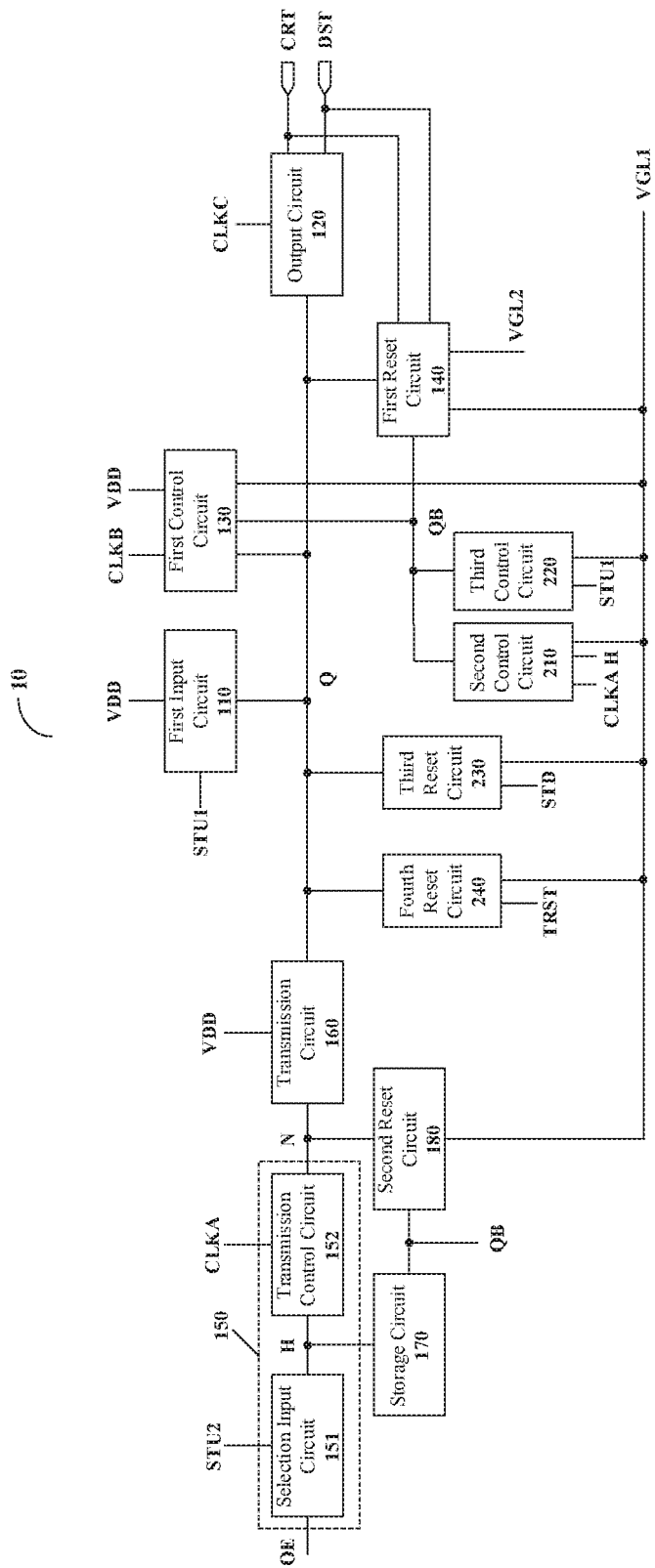
FIG. 4 is a schematic diagram of still another shift register unit provided by some embodiments of the present disclosure.

For example, as shown in FIG. 3 or FIG. 4, in other embodiments, the storage circuit 170 may also be connected to the fourth node H. For example, when the storage circuit 170 includes a capacitor, a first electrode of the capacitor may be connected to the fourth node H.

In the shift register unit 10 provided by some embodiments of the present disclosure, in the case where the storage circuit 170 is connected to both the second node QB and the fourth node H, the storage circuit 170 can be used not only to stabilize the level of the second node QB, but also to stabilize the level of the fourth node H.

It should be noted that, in the embodiments of the present disclosure, the high level and the low level are relative. A high level indicates a higher voltage range (e.g., a high level may adopt 5V, 10V, or other suitable voltages), and a plurality of high levels may be the same or different. Similarly, a low level indicates a lower voltage range (e.g., a low level may adopt 0V, −5V, −10V, or other suitable voltages), and a plurality of low levels may be the same or different. For example, the minimum value of the high levels is greater than the maximum value of the low levels.

In addition, it should be noted that, in the embodiments of the present disclosure, controlling the level of a node (e.g., the first node Q, the second node QB, etc.) includes charging the node to pull up the level of the node, discharging the node to pull down the level of the node. For example, a capacitor electrically connected to the node may be provided, and charging the node means charging the capacitor electrically connected to the node; similarly, discharging the node means discharging the capacitor electrically connected to the node; the capacitor can maintain the high or low level of the node.

As shown in FIG. 2, the shift register unit 10 provided by some embodiments of the present disclosure further includes a second reset circuit 180, and the second reset circuit 180 is configured to reset the third node N under the control of the level of the second node QB.

For example, the second reset circuit 180 is connected to the second node QB and the third node N, and is configured to receive the first voltage VGL1 at a low level. For example, in the case where the level of the second node QB is a high level, the second reset circuit 180 can be turned on under the control of the level of the second node QB, so that the third node N may be reset with the first voltage VGL1 at a low level.

In the shift register unit 10 provided by some embodiments of the present disclosure, in the case where the level of the second node QB is a high level, the level of the third node N may be pulled down to a low level by the second reset circuit 180, so that the transmission circuit 160 can be turned off, thereby preventing the transmission circuit 160 from charging the first node Q, and thereby further avoiding the problem that the shift register unit 10 outputs signals multiple times.

In the shift register unit 10 provided by some embodiments of the present disclosure, as shown in FIGS. 2-4, the first control circuit 130 is further configured to transmit the second voltage VDD to the second node QB under the control of the second clock signal CLKB. The output circuit 120 is further configured to receive the third clock signal CLKC, and provide the third clock signal CLKC to the output terminal OP (for example, including the shifting signal output terminal CRT and the driving signal output terminal DST) as an output signal.

Figure 11:
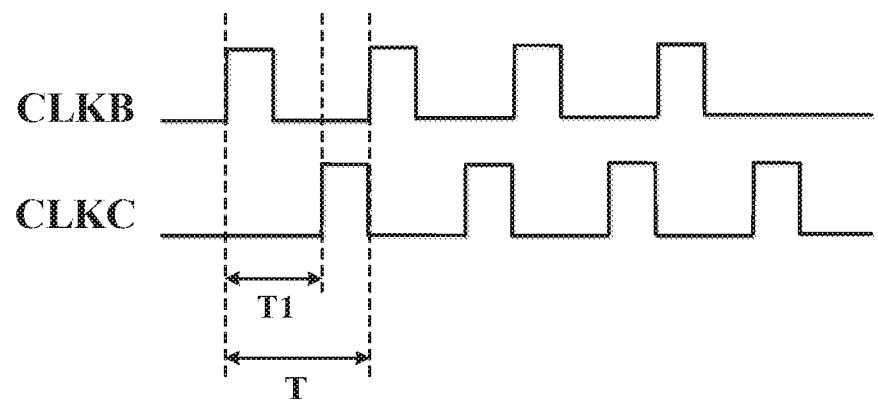
FIG. 11 is a schematic diagram of a second clock signal and a third clock signal provided by some embodiments of the present disclosure.

FIG. 11 is a schematic diagram of a second clock signal and a third clock signal provided by some embodiments of the present disclosure. For example, as shown in FIG. 11, both the second clock signal CLKB and the third clock signal CLKC are pulse signals with a duty ratio of one third, the third clock signal CLKC and the second clock signal CLKB are separated in timing by a first time interval T1, and the first time interval T1 is equal to two thirds of the period T of the pulse signal.

As shown in FIG. 4, the shift register unit 10 provided by some embodiments of the present disclosure further includes a second control circuit 210, which is configured to control the level of the second node QB under the control of the first clock signal CLKA and the level of the fourth node H.

For example, the second control circuit 210 is connected to the second node QB and the fourth node H, and is configured to receive the first clock signal CLKA and the first voltage VGL1 at a low level. For example, in a blanking period of a frame, when the fourth node H is at a high level and the first clock signal CLKA is at a high level, the second control circuit 210 is turned on, so that the second node QB can be pulled down with the first voltage VGL1 at a low level.

In the shift register unit 10 provided by some embodiments of the present disclosure, for example, in a blanking period of a frame, when the first clock signal CLKA is at a high level and the fourth node H is at a high level, the transmission circuit 160 in the shift register unit 10 is turned on, so that the first node Q can be charged. While the transmission circuit 160 charges the first node Q, pulling down the level of the second node QB to a low level through the second control circuit 210 can avoid the influence of the second node QB on the first node Q, so that the transmission circuit 160 charges the first node Q more sufficiently, thereby facilitating normally outputting the driving signal OUT by the shift register unit 10 during the blanking period. For example, the driving signal OUT may be used to drive sensing transistors in a row of sub-pixel units in the display panel to complete external compensation of the row of sub-pixel units.

As shown in FIG. 4, the shift register unit 10 provided by some embodiments of the present disclosure further includes a third control circuit 220. The third control circuit 220 is configured to control the level of the second node QB in response to the first input signal STU1.

For example, the third control circuit 220 is connected to the second node QB, and is configured to receive the first input signal STU1 and the first voltage VGL1 at a low level. For example, in a display period of a frame, the third control circuit 220 is turned on in response to the first input signal STU1, so that the second node QB can be pulled down and reset with the first voltage VGL1 at a low level. Pulling down the second node QB to a low level can avoid the influence of the second node QB on the first node Q, thereby making the first node Q more sufficiently charged in the display period.

As shown in FIG. 4, the shift register unit 10 provided by some embodiments of the present disclosure further includes a third reset circuit 230 and a fourth reset circuit 240.

The third reset circuit 230 is configured to reset the first node Q in response to a display reset signal STD. For example, the third reset circuit 230 is connected to the first node Q, and is configured to receive the display reset signal STD and the first voltage VGL1 at a low level. For example, in a display period of a frame, the third reset circuit 230 is turned on in response to the display reset signal STD, so that the first node Q can be pulled down and reset with the first voltage VGL1 at a low level. For example, in the case where a plurality of shift register units 10 are cascaded to form a gate driving circuit, a shift register unit 10 of a certain stage may receive the shifting signal CR output by a shift register unit 10 of another stage as the display reset signal STD.

The fourth reset circuit 240 is configured to reset the first node Q in response to a global reset signal TRST. For example, the fourth reset circuit 240 is connected to the first node Q, and is configured to receive the global reset signal TRST and the first voltage VGL1 at a low level. For example, in the case where a plurality of shift register units 10 are cascaded to form a gate driving circuit, before a display period of a frame, the fourth reset circuit 240 in the shift register unit 10 of each stage is turned on in response to the global reset signal TRST, so that the first voltage VGL1 at a low level can pull down and reset the first node Q through the fourth reset circuit 240.

It should be noted that in the embodiments of the present disclosure, each node (the first node Q, the second node QB, the third node N, the fourth node H, etc.) and each output terminal (the output terminal OP, the shifting signal output terminal CRT, the driving signal output terminal DST, etc.) are provided to describe the circuit structure better, and do not represent actual components. A node represents a meeting point of related circuit connections in a circuit structure, that is, related circuits connected to the node with the same identifier are electrically connected to each other. For example, as shown in FIG. 4, the first control circuit 130, the first reset circuit 140, the second control circuit 210, the third control circuit 220, the storage circuit 170, and the second reset circuit 180 are all connected to the second node QB, which means that these circuits are electrically connected to each other.

Those skilled in the art can understand that although a plurality of control circuits and a plurality of reset circuits are shown in FIG. 4, the above examples do not limit the protection scope of the present disclosure. In actual applications, technicians can choose to use or not use one or more of the above circuits according to actual situations. Various combinations and modifications based on the foregoing circuits do not deviate from the principles of the present disclosure, and will not be described again.

Figure 5:
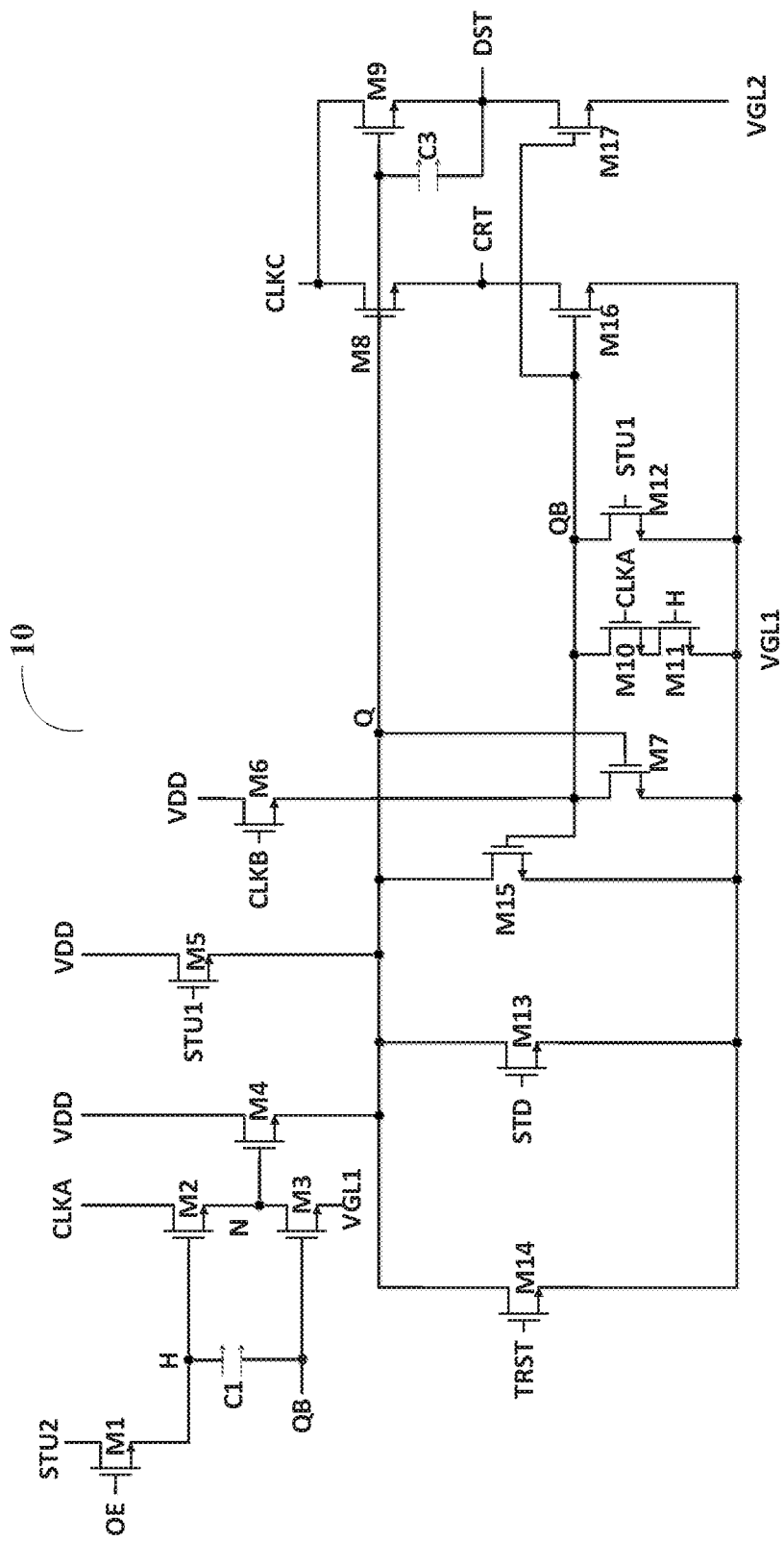
FIG. 5 is a circuit diagram of a shift register unit provided by some embodiments of the present disclosure.

In some embodiments of the present disclosure, the shift register unit 10 shown in FIG. 4 may be implemented as the circuit structure shown in FIG. 5. As shown in FIG. 5, the shift register unit 10 includes a first transistor M1 to a seventeenth transistor M17, a first capacitor C1, and a third capacitor C3. The shift register unit 10 of FIGS. 1-3 can be implemented in a similar manner, for example, one electrode of the capacitor as the storage circuit 170 is connected to the second node QB, and the other electrode of the capacitor is connected to other corresponding nodes (e.g., the fourth node H) or is configured to receive a fixed level (e.g., the first voltage VGL1).

As shown in FIG. 5, the selection input circuit 151 may be implemented as a first transistor M1. A gate electrode of the first transistor M1 is configured to receive the selection control signal OE, a first electrode of the first transistor M1 is configured to receive the second input signal STU2, and a second electrode of the first transistor M1 is connected to the fourth node H. For example, when the selection control signal OE is at a high level, the first transistor M1 is turned on, so that the fourth node H can be charged with the second input signal STU2. For example, in some embodiments, the second input signal STU2 may be the shifting signal CR output by the shift register unit 10, and the signal timing of the selection control signal OE and the second input signal STU2 are the same, that is, both the selection control signal OE and the second input signal STU2 are at a high level at the same time.

As shown in FIG. 5, the transmission control circuit 152 may be implemented as a second transistor M2. A gate electrode of the second transistor M2 is connected to the fourth node H, a first electrode of the second transistor M2 is configured to receive the first clock signal CLKA, and a second electrode of the second transistor M2 is connected to the third node N. For example, when the fourth node H is at a high level, the second transistor M2 is turned on, so that the first clock signal CLKA can be transmitted to the third node N to pull up the level of the third node N.

As shown in FIG. 5, the second reset circuit 180 may be implemented as a third transistor M3. A gate electrode of the third transistor M3 is connected to the second node QB, a first electrode of the third transistor M3 is connected to the third node N, and a second electrode of the third transistor M3 is configured to receive the first voltage VGL1 at a low level. For example, when the level of the second node QB is a high level, the third transistor M3 is turned on, and the first voltage VGL1 at a low level may reset the third node N through the third transistor M3.

As shown in FIG. 5, the transmission circuit 160 may include a fourth transistor M4. A gate electrode of the fourth transistor M4 is connected to the third node N, a first electrode of the fourth transistor M4 is configured to receive the second voltage VDD at a high level, and a second electrode of the fourth transistor M4 is connected to the first node Q. For example, when the level of the third node N is a high level, the fourth transistor M4 is turned on, and the second voltage VDD may charge the first node Q through the fourth transistor M4.

For example, in the case where the shift register unit 10 does not need to output a driving signal, the level of the second node QB is a high level, and the first voltage VGL1 at a low level resets the third node N through the third transistor M3 to pull down the level of the third node N. Because the third node N is at a low level, the fourth transistor M4 is turned off, so that the second node VDD can be prevented from charging the first node Q.

As shown in FIG. 5, the first input circuit 110 may be implemented as a fifth transistor M5. A gate electrode of the fifth transistor is configured to receive the first input signal STU1, a first electrode of the fifth transistor M5 is configured to receive the second voltage VDD, and a second electrode of the fifth transistor M5 is connected to the first node Q. For example, in the case where a plurality of shift register units 10 are cascaded to form a gate driving circuit, a shift register unit 10 of a certain stage may receive the shifting signal CR of a shift register unit 10 of a previous stage as the first input signal STU1 of the shift register unit 10 of the present stage. For example, when the first input signal STU1 is at a high level, the fifth transistor M5 is turned on, and the second voltage VDD at a high level can charge the first node Q through the fifth transistor M5 to pull up the level of the first node Q.

It should be noted that in some embodiments of the present disclosure, the first electrode of the fifth transistor M5 may also be configured to receive the first input signal STU1, and when being turned on under the control of the first input signal STU1, the fifth transistor M5 may directly charge the first node Q with the first input signal STU1. The implementation of the first input circuit 110 is not limited in the embodiments of the present disclosure.

As shown in FIG. 5, the output circuit 120 may be implemented to include an eighth transistor M8, a ninth transistor M9, and a third capacitor C3.

A gate electrode of the eighth transistor M8 is connected to the first node Q, a first electrode of the eighth transistor M8 is configured to receive the third clock signal CLKC, and a second electrode of the eighth transistor M8 is connected to the shifting signal output terminal CRT.

A gate electrode of the ninth transistor M9 is connected to the first node Q, a first electrode of the ninth transistor M9 is configured to receive the third clock signal CLKC, and a second electrode of the ninth transistor M9 is connected to the driving signal output terminal DST.

A first electrode of the third capacitor C3 is connected to the first node Q, and a second electrode of the third capacitor C3 is connected to the driving signal output terminal DST.

For example, when the first node Q is at a high level, the eighth transistor M8 and the ninth transistor M9 are turned on, and the eighth transistor M8 may provide the third clock signal CLKC to the shifting signal output terminal CRT as the shifting signal CR, for example the shifting signal CR may be provided to an adjacent shift register unit 10 as the first input signal STU1 or the display reset signal STD. In addition, the ninth transistor M9 may provide the third clock signal CLKC to the driving signal output terminal DST as the driving signal OUT. For example, in a display period of a frame, the driving signal OUT may drive a row of sub-pixel units in the display panel to perform display scanning; for another example, in a blanking period of a frame, the driving signal OUT may be used to drive sensing transistors in a row of sub-pixel units in the display panel to complete external compensation of the row of sub-pixel units.

In the shift register unit 10 provided by some embodiments of the present disclosure, the level of the first node Q can be maintained by the third capacitor C3. It should be noted that the second electrode of the third capacitor C3 may also be connected to the shifting signal output terminal CRT, which is not limited in the embodiments of the present disclosure. For example, when the shifting signal output terminal CRT or the driving signal output terminal DST outputs a signal at a high level, the signal at a high level can further pull up the level of the first node Q through the coupling effect of the third capacitor C3, so that the eighth transistor M8 and the ninth transistor M9 are turned on more sufficiently, thereby facilitating the outputting of the shifting signal CR and the driving signal OUT.

As shown in FIG. 5, the first control circuit 130 may be implemented to include a sixth transistor M6 and a seventh transistor M7.

A gate electrode of the sixth transistor M6 is configured to receive the second clock signal CLKB, a first electrode of the sixth transistor M6 is configured to receive the second voltage VDD, and a second electrode of the sixth transistor M6 is connected to the second node QB.

A gate electrode of the seventh transistor M7 is connected to the first node Q, a first electrode of the seventh transistor M7 is connected to the second node QB, and a second electrode of the seventh transistor M7 is configured to receive the first voltage VGL1.

For example, when the level of the first node Q is a high level, the seventh transistor M7 is turned on, and the first voltage VGL1 at a low level may reset the second node QB.

For example, when the level of the first node Q is a low level and the level of the second clock signal CLKB is a high level, the sixth transistor M6 is turned on, the seventh transistor M7 is turned off, and the second voltage VDD at a high level can charge the second node QB through the sixth transistor M6, thereby pulling up the level of the second node QB to a high level.

As shown in FIG. 5, the second control circuit 210 may be implemented to include a tenth transistor M10 and an eleventh transistor M11.

A gate electrode of the tenth transistor M10 is configured to receive the first clock signal CLKA, a first electrode of the tenth transistor M10 is connected to the second node QB, a second electrode of the tenth transistor M10 is connected to a first electrode of the eleventh transistor M11, a gate electrode of the eleventh transistor M11 is connected to the fourth node H, and a second electrode of the eleventh transistor M11 is configured to receive the first voltage VGL1. For example, when the first clock signal CLKA is at a high level and the fourth node H is at a high level, the tenth transistor M10 and the eleventh transistor M11 are turned on, so that the first voltage VGL1 at a low level can pull down and reset the second node QB.

As shown in FIG. 5, the third control circuit 220 may be implemented as a twelfth transistor M12. A gate electrode of the twelfth transistor M12 is configured to receive the first input signal STU1, a first electrode of the twelfth transistor M12 is connected to the second node QB, and a second electrode of the twelfth transistor M12 is configured to receive the first voltage VGL1. For example, when the first input signal STU1 is at a high level, the twelfth transistor M12 is turned on, so that the first voltage VGL1 at a low level can pull down and reset the second node QB.

As shown in FIG. 5, the first reset circuit 140 may be implemented to include a fifteenth transistor M15, a sixteenth transistor M16, and a seventeenth transistor M17.

A gate electrode of the fifteenth transistor M15 is connected to the second node QB, a first electrode of the fifteenth transistor M15 is connected to the first node Q, and a second electrode of the fifteenth transistor M15 is configured to receive the first voltage VGL1.

A gate electrode of the sixteenth transistor M16 is connected to the second node QB, a first electrode of the sixteenth transistor M16 is connected to the shifting signal output terminal CRT, and a second electrode of the sixteenth transistor M16 is configured to receive the first voltage VGL1.

A gate electrode of the seventeenth transistor M17 is connected to the second node QB, a first electrode of the seventeenth transistor M17 is connected to the driving signal output terminal DST, and a second electrode of the seventeenth transistor M17 is configured to receive the third voltage VGL2.

For example, when the second node QB is at a high level, the fifteenth transistor M15 and the sixteenth transistor M16 are turned on, so that the first voltage VGL1 at a low level can reset the first node Q and the shifting signal output terminal CRT; meanwhile, the seventeenth transistor M17 is turned on, so that the third voltage VGL2 at a low level can reset the driving signal output terminal DST.

It should be noted that, in some embodiments of the present disclosure, the second electrode of the seventeenth transistor M17 may also be configured to receive the first voltage VGL1, so as to reset the driving signal output terminal DST with the first voltage VGL1.

As shown in FIG. 5, the third reset circuit 230 may be implemented as a thirteenth transistor M13. A gate electrode of the thirteenth transistor M13 is configured to receive the display reset signal STD, a first electrode of the thirteenth transistor M13 is connected to the first node Q, and a second electrode of the thirteenth transistor M13 is configured to receive the first voltage VGL1.

For example, in the case where a plurality of shift register units 10 are cascaded to form a gate driving circuit, a shift register unit 10 of a certain stage can receive the shifting signal CR of a shift register unit 10 of a next stage as the display reset signal STD of the shift register unit 10 of the present stage. For example, when the display reset signal STD is at a high level, the thirteenth transistor M13 is turned on, so that the first voltage VGL1 at a low level can pull down and reset the first node Q.

As shown in FIG. 5, the fourth reset circuit 240 may be implemented as a fourteenth transistor M14. A gate electrode of the fourteenth transistor M14 is configured to receive the global reset signal TRST, a first electrode of the fourteenth transistor M14 is connected to the first node Q, and a second electrode of the fourteenth transistor M14 is configured to receive the first voltage VGL1.

For example, in the case where a plurality of shift register units 10 are cascaded to form a gate driving circuit, before a display period of a frame, the fourteenth transistor M14 in the shift register unit 10 of each stage is turned on in response to the global reset signal TRST, thereby implementing global resetting of the gate driving circuit.

As shown in FIG. 5, the storage circuit 170 may be implemented as a first capacitor C1, a first electrode of the first capacitor C1 is connected to the fourth node H, and a second electrode of the first capacitor C1 is connected to the second node QB. The first capacitor C1 can stabilize the level of the second node QB. For example, when the second clock signal CLKB is at a high level, the second voltage VDD charges the second node QB through the sixth transistor M6, thereby pulling up the level of the second node QB to a high level. Then, when the level of the second clock signal CLKB becomes a low level, the sixth transistor M6 is turned off, that is, the charging path for the second node QB is cut off. In this case, because the first capacitor C1 is connected to the second node QB, the first capacitor C1 can maintain the high level of the second node QB, thereby preventing the influence caused by the drifting of the level of the second node QB on the level of the first node Q.

In the shift register unit 10 provided by some embodiments of the present disclosure, the first capacitor C1 is connected to the fourth node H in addition to the second node QB, so that the first capacitor C1 can also be used to stabilize the level of the fourth node H. In this way, the first capacitor C1 can be reused to reduce the number of capacitors, thereby simplifying the circuit structure and reducing the bezel size of the display device using the shift register unit 10, which is more conducive to improving the PPI of the display device.

Figure 6:
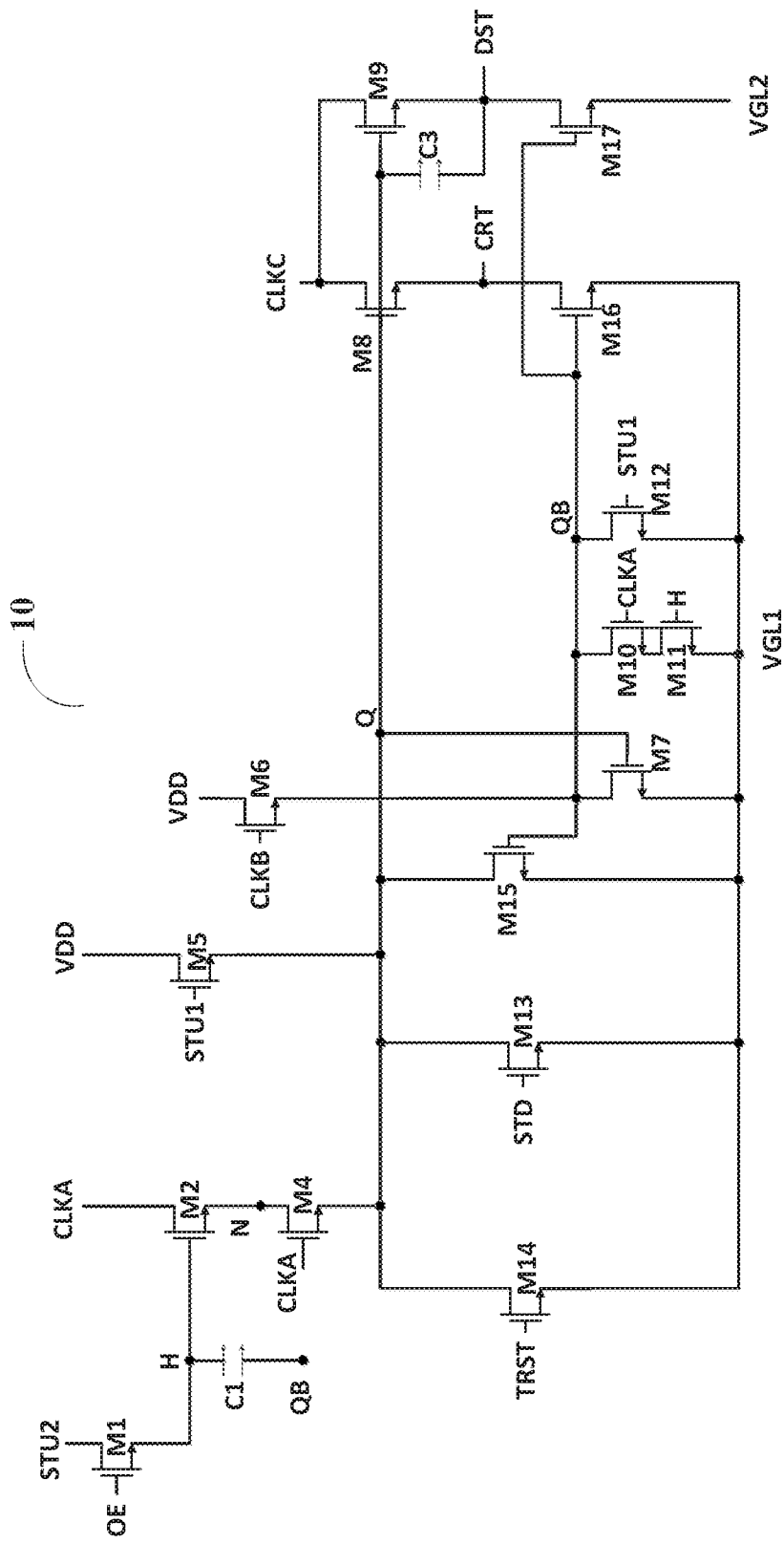
FIG. 6 is a circuit diagram of another shift register unit provided by some embodiments of the present disclosure.

In some embodiments of the present disclosure, the shift register unit 10 may also be implemented as the circuit structure shown in FIG. 6. Only the differences between the shift register unit 10 shown in FIG. 6 and the shift register unit 10 shown in FIG. 5 will be described below, and the same portions will not be described again.

As shown in FIG. 6, the shift register unit 10 does not include the second reset circuit 180, that is, does not include the third transistor M3.

As shown in FIG. 6, in the shift register unit 10, the gate electrode of the fourth transistor M4 is configured to receive the first clock signal CLKA, the first electrode of the fourth transistor M4 is connected to the third node N, and the second electrode of the fourth transistor M4 is connected to the first node Q. For example, when the level of the fourth node H is a high level and the level of the first clock signal CLKA is a high level, both the second transistor M2 and the fourth transistor M4 are turned on, so that the first clock signal CLKA at a high level can charge the first node Q through the second transistor M2 and the fourth transistor M4.

Figure 7:
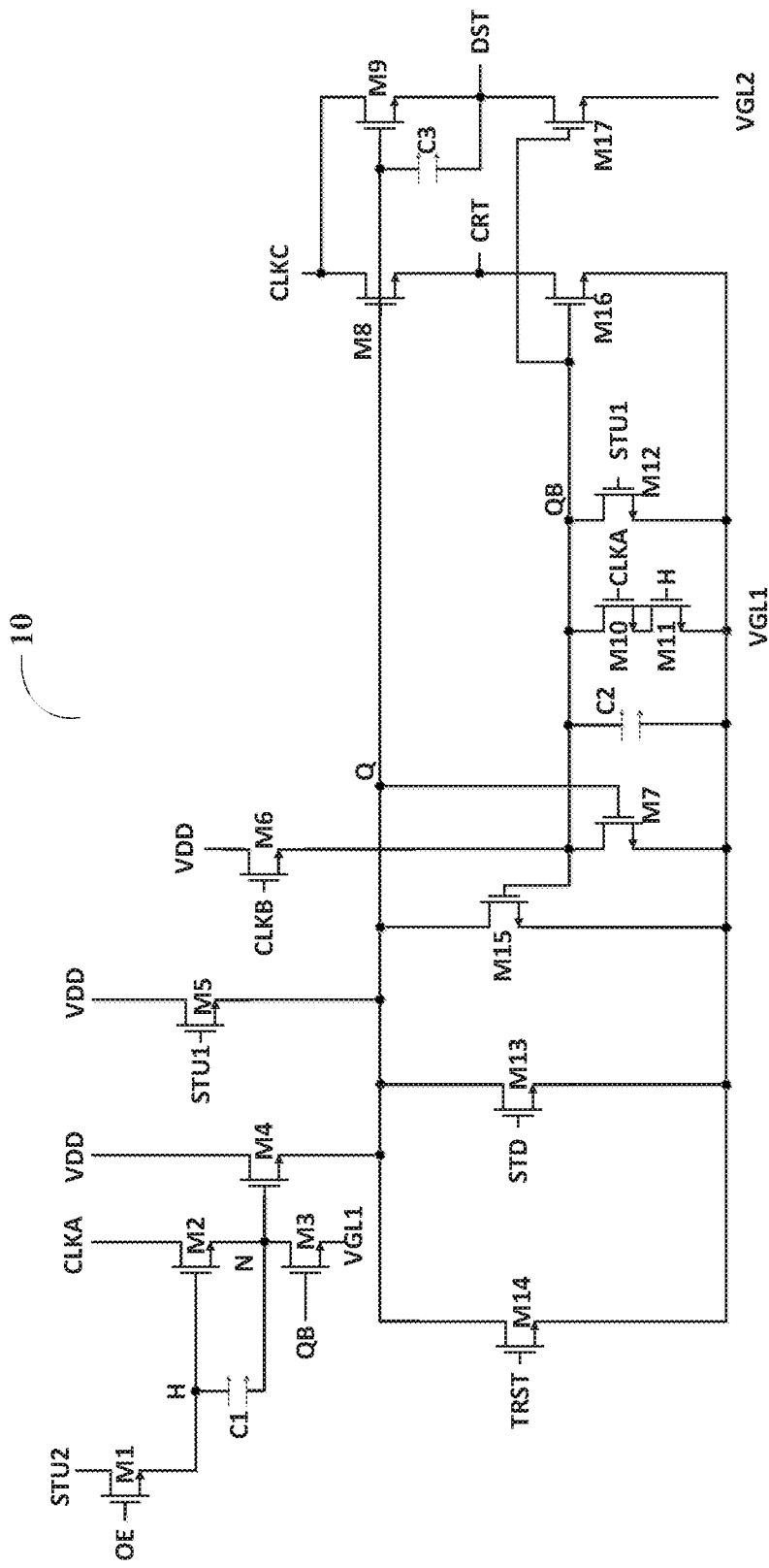
FIG. 7 is a circuit diagram of yet another shift register unit provided by some embodiments of the present disclosure.

In some embodiments of the present disclosure, the shift register unit 10 may also be implemented as the circuit structure shown in FIG. 7. Only the differences between the shift register unit 10 shown in FIG. 7 and the shift register unit 10 shown in FIG. 5 will be described below, and the same portions will not be described again.

As shown in FIG. 7, in the shift register unit 10, the selection input circuit 151 is implemented to include a first transistor M1 and a first capacitor C1, and the storage circuit 170 is implemented as a second capacitor C2.

As shown in FIG. 7, the first electrode of the first capacitor C1 is connected to the fourth node H, and the second electrode of the first capacitor C1 is connected to the third node N. A first electrode of the second capacitor C2 is connected to the second node QB, and a second electrode of the second capacitor C2 is configured to receive a fixed level, for example, to receive the first voltage VGL1. The connection manner of the second capacitor C2 is not limited in the embodiment of the present disclosure, and the second electrode of the second capacitor C2 may also receive other fixed levels, such as the second voltage VDD, the third voltage VGL2, and so on. In the shift register unit 10 provided by some embodiments of the present disclosure, the second capacitor C2 may be used to stabilize the level of the second node QB.

Figure 8:
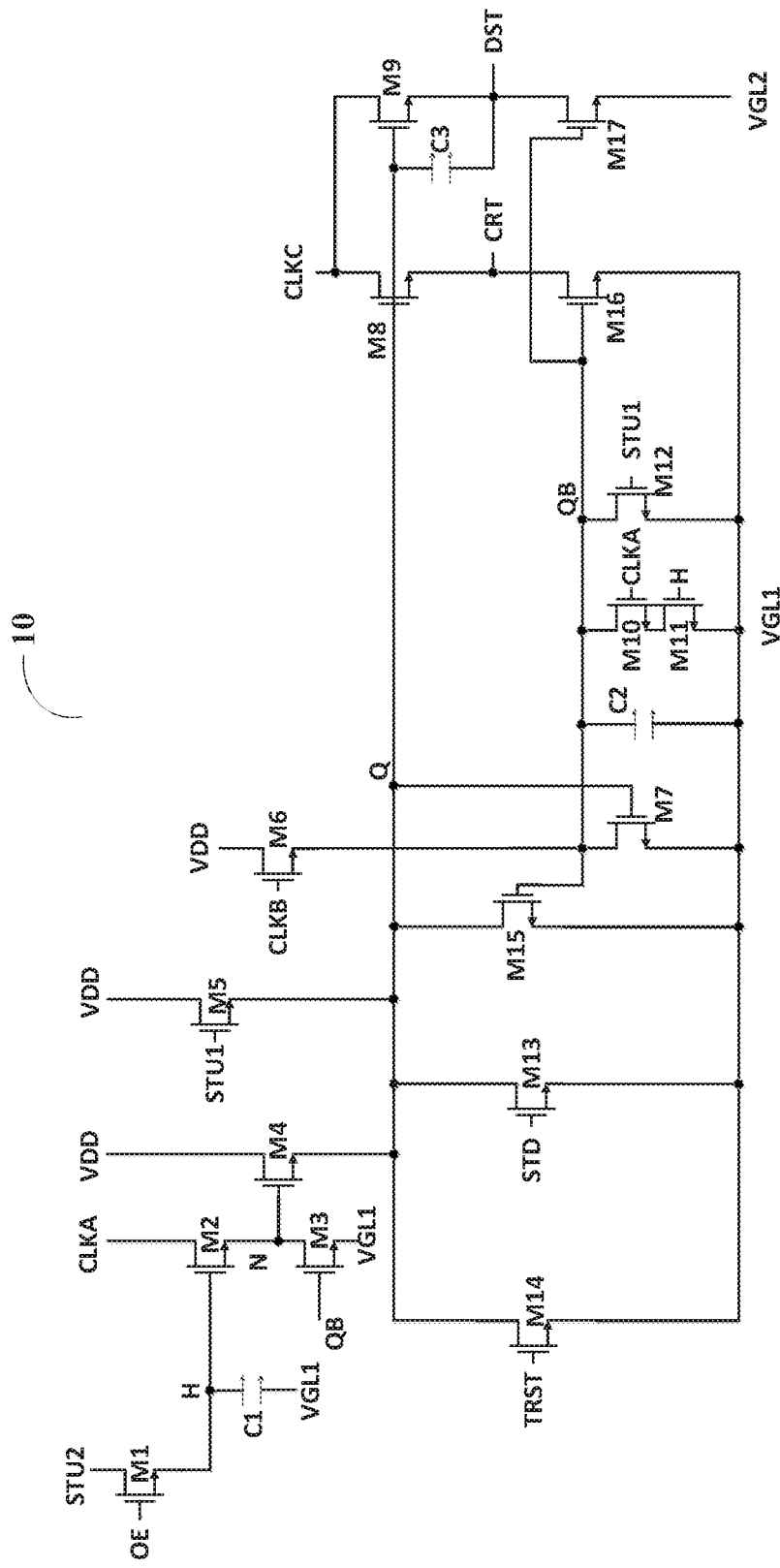
FIG. 8 is a circuit diagram of still another shift register unit provided by some embodiments of the present disclosure.

In some embodiments of the present disclosure, the shift register unit 10 may also be implemented as the circuit structure shown in FIG. 8. Only the differences between the shift register unit 10 shown in FIG. 8 and the shift register unit 10 shown in FIG. 7 will be described below, and the same portions will not be described again.

As shown in FIG. 8, the first electrode of the first capacitor C1 is connected to the fourth node H, and the second electrode of the first capacitor C1 is configured to receive the first voltage VGL1. It should be noted that the connection manner of the first capacitor C1 is not limited in the embodiment of the present disclosure. For example, the second electrode of the first capacitor C1 may also be configured to receive other fixed levels, for example, to receive the second voltage VDD, the third voltage VGL2, and so on.

It should be noted that the transistors in the shift register unit 10 provided by the embodiments of the present disclosure are all described as N-type transistors as an example.

The transistors adopted in the embodiments of the present disclosure may all be thin film transistors, field effect transistors, or other switching elements with the same characteristics. In the embodiments of the present disclosure, the thin film transistors are taken as an example for description. The source electrode and the drain electrode of a transistor adopted here may be symmetrical in structure, so the source electrode and the drain electrode of the transistor may have no difference in structure. In the embodiments of the present disclosure, in order to distinguish two electrodes of the transistor other than the gate electrode, one electrode is directly described as the first electrode and the other electrode is directly described as the second electrode. In addition, transistors can be divided into N-type and P-type transistors according to their characteristics. In the case where the transistor is an N-type transistor, the turn-on voltage is a high-level voltage (e.g., 5V, 10V or other suitable voltage), and the turn-off voltage is a low-level voltage (e.g., 0V, −5V, −10V or other suitable voltage); the transistors in the following embodiments are also described as N-type transistors as an example, which will not be repeated. The embodiments of the present disclosure include but are not limited thereto, for example, one or more transistors in the shift register unit provided by the embodiments of the present disclosure may also adopt P-type transistors. In the case where the transistor is a P-type transistor, the turn-on voltage is a low-level voltage (e.g., 0V, −5V, −10V or other suitable voltage), and the turn-off voltage is a high-level voltage (e.g., 5V, 10V or other suitable voltage).

As described above, in the shift register unit 10 provided by the embodiments of the present disclosure, the first capacitor C1 may be used to stabilize the level of the fourth node H or the second node QB, the second capacitor C2 may be used to stabilize the level of the second node QB, and the third capacitor C3 may be used to stabilize the level of the first node Q. The first capacitor C1, the second capacitor C2, and the third capacitor C3 may be capacitor devices prepared by a manufacturing process, for example, the capacitor device is implemented by preparing a special capacitor electrode, and each electrode of the capacitor can be implemented by a metal layer, a semiconductor layer (e.g., doped polysilicon), etc., or in some examples, by setting circuit wiring parameters, the first capacitor C1, the second capacitor C2, and the third capacitor C3 may also be implemented by parasitic capacitances between various devices. The connection manner of the first capacitor C1, the second capacitor C2 and the third capacitor C3 is not limited to the manner described above, and may be other suitable connection manners as long as the levels written to the fourth node H, the second node QB, and the first node Q can be stored.

Figure 9:
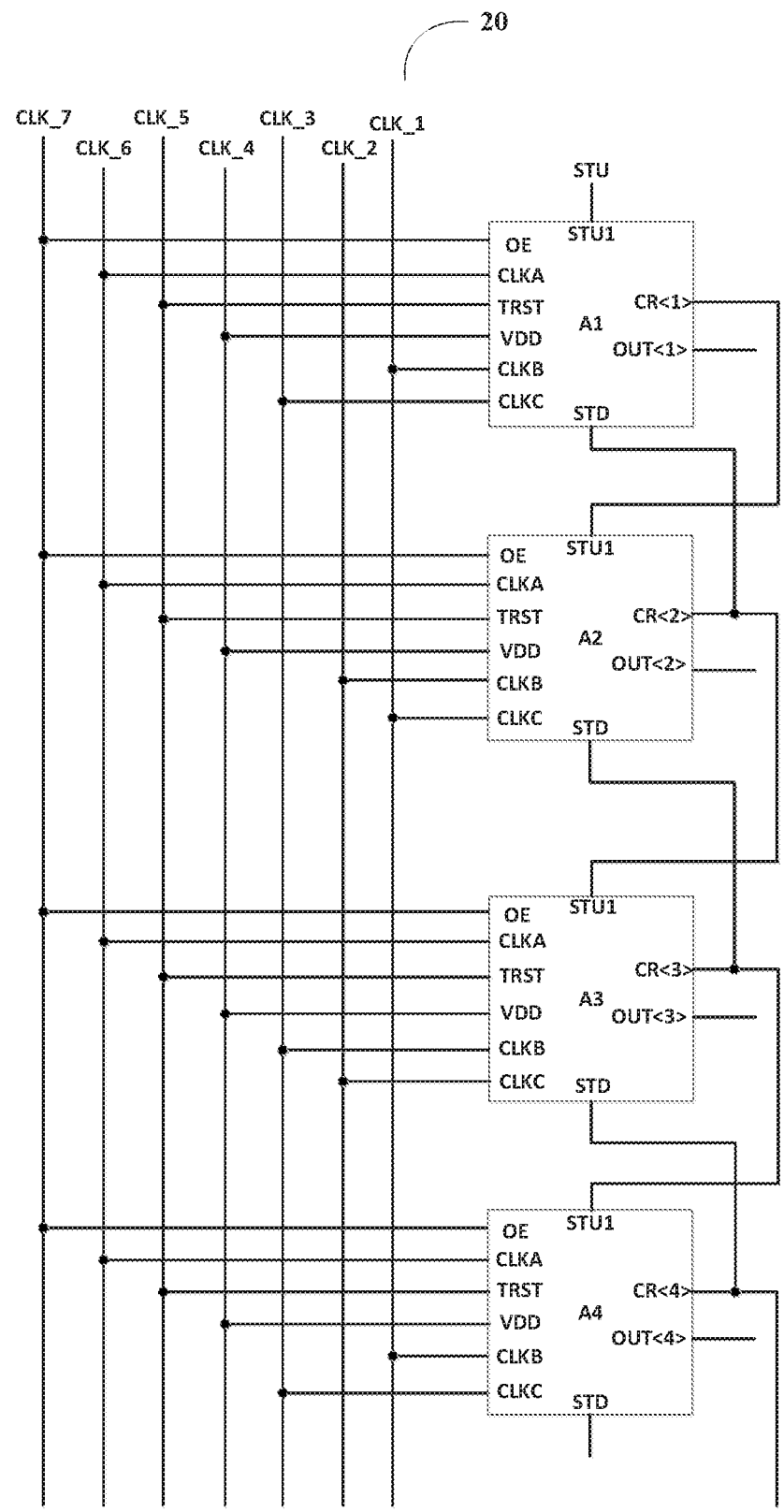
FIG. 9 is a schematic diagram of a gate driving circuit provided by some embodiments of the present disclosure.

Some embodiments of the present disclosure also provide a gate driving circuit 20. As shown in FIG. 9, the gate driving circuit 20 includes a plurality of cascaded shift register units 10, where any one or more of the shift register units 10 may adopt the structure of the shift register unit 10 provided by the embodiments of the present disclosure or a modification thereof. A1, A2, A3, and A4 in FIG. 9 represent four cascaded shift register units 10. In the case where the gate driving circuit 20 is used to drive a display panel, output signals of A1, A2, A3, and A4 can respectively drive four rows of sub-pixel units in the display panel. For example, A1, A2, A3, and A4 can drive the first, second, third, and fourth rows of sub-pixel units of the display panel, respectively.

The gate driving circuit 20 provided by the embodiment of the present disclosure can stabilize the level of the second node QB, and when there is no need to output a driving signal, the second node QB can be stably maintained at a high level, so that the level of the first node Q does not drift and is stably maintained at a low level, thereby avoiding the problem that the gate driving circuit 20 outputs signals multiple times. In this case, the gate driving circuit 20 can also realize random compensation, so as to avoid the problems of poor display effects such as scanning lines and uneven display brightness caused by the progressive sequential compensation.

Next, by taking the gate driving circuit 20 shown in FIG. 9 as an example, signal lines in the gate driving circuit 20 will be described.

As shown in FIG. 9, the gate driving circuit 20 includes a first sub-clock signal line CLK_1, a second sub-clock signal line CLK_2, and a third sub-clock signal line CLK_3.

The (3n−2)-th shift register unit (e.g., the first shift register unit A1) is connected to the first sub-clock signal line CLK_1 to receive the second clock signal CLKB for the (3n−2)-th shift register unit, and the (3n−2)-th shift register unit is connected to the third sub-clock signal line CLK_3 to receive the third clock signal CLKC for the (3n−2)-th shift register unit.

The (3n−1)-th shift register unit (e.g., the second shift register unit A2) is connected to the second sub-clock signal line CLK_2 to receive the second clock signal CLKB for the (3n−1)-th shift register unit, and the (3n−1)-th shift register unit is connected to the first sub-clock signal line CLK_1 to receive the third clock signal CLKC for the (3n−1)-th shift register unit.

The (3n)-th shift register unit (e.g., the third shift register unit A3) is connected to the third sub-clock signal line CLK_3 to receive the second clock signal CLKB for the (3n)-th shift register unit, and the (3n)-th shift register unit is connected to the second sub-clock signal line CLK_2 to receive the third clock signal CLKC for the (3n)-th shift register unit; n is an integer greater than zero.

Figure 10:
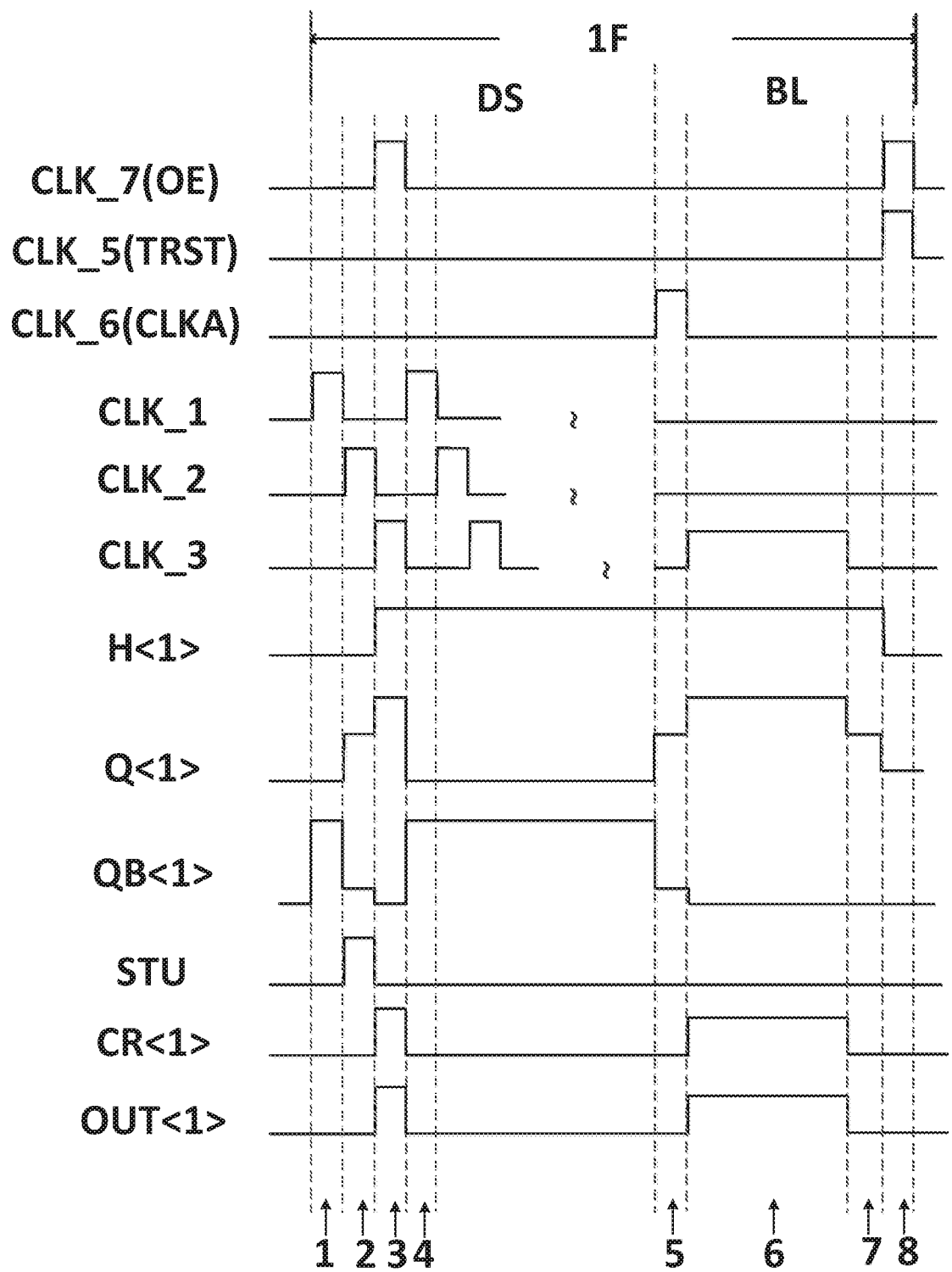
FIG. 10 is a signal timing diagram, corresponding to the operation of the gate driving circuit shown in FIG. 9, provided by some embodiments of the present disclosure.

The signal timing provided by the first sub-clock signal line CLK_1, the second sub-clock signal line CLK_2, and the third sub-clock signal line CLK_3 is shown in FIG. 10. As shown in FIG. 10, the signals provided by the first sub-clock signal line CLK_1, the second sub-clock signal line CLK_2, and the third sub-clock signal line CLK_3 are all pulse signals with a duty ratio of one third.

In the gate driving circuit 20 provided by the embodiment of the present disclosure, the second clock signal CLKB and the third clock signal CLKC are provided to the shift register unit 10 of each stage through three sub-clock signal lines, so as to reduce the number of signal lines, thereby simplifying the circuit structure and reducing the bezel size of the display device using the shift register unit 10, which is more conducive to improving the PPI of the display device.

As shown in FIG. 9, the gate driving circuit 20 further includes a fourth sub-clock signal line CLK_4, a fifth sub-clock signal line CLK_5, a sixth sub-clock signal line CLK_6, and a seventh sub-clock signal line CLK_7.

For example, the shift register unit 10 of each stage in the gate driving circuit 20 is connected to the fourth sub-clock signal line CLK_4 to receive the second voltage VDD. Each shift register unit 10 in the gate driving circuit 20 is connected to the fifth sub-clock signal line CLK_5 to receive the global reset signal TRST. The shift register unit 10 of each stage in the gate driving circuit 20 is connected to the sixth sub-clock signal line CLK_6 to receive the first clock signal CLKA. The shift register unit 10 of each stage in the gate driving circuit 20 is connected to the seventh sub-clock signal line CLK_7 to receive the selection control signal OE.

As shown in FIG. 9, except the shift register unit 10 of the first stage, shift register units 10 of other stages are each connected to the shift register unit 10 of a previous stage to receive the shifting signal CR as the first input signal STU1. Except the shift register unit 10 of the last stage, shift register units 10 of other stages are each connected to the shift register unit 10 of a next stage to receive the shifting signal CR as the display reset signal STD.

It should be noted that the cascading relationship shown in FIG. 9 is only an example, and according to the description of the present disclosure, other cascading relationships may also be adopted according to actual conditions.

For example, in some embodiments, the shift register unit 10 in the gate driving circuit 20 shown in FIG. 9 may adopt the circuit structure shown in FIG. 5. FIG. 10 shows a signal timing diagram of the gate driving circuit 20 in FIG. 9 in a working state.

In FIG. 10, H<1> represents the fourth node H in the shift register unit 10 of the first stage, and the shift register unit 10 of the first stage corresponds to the first row of sub-pixel units in the display panel. Q<1> represents the first node Q in the shift register unit 10 of the first stage. QB<1> represents the second node QB in the shift register unit 10 of the first stage. The numbers in parentheses indicate the row number of sub-pixel units in the display panel corresponding to the shift register unit 10. The same case applies to following embodiments, and will not be repeated.

STU represents the first input signal provided to the shift register unit 10 of the first stage, CR<1> represents the shifting signal CR output by the shift register unit 10 of the first stage, and OUT<1> represents the driving signal OUT output by the shift register unit 10 of the first stage. For example, as shown in FIG. 10, in this embodiment, CR<1> is the same as OUT<1>.

1F represents a first frame, DS represents a display period in the first frame, and BL represents a blanking period in the first frame. It should be noted that the signal level in the signal timing diagram shown in FIG. 10 is only schematic and does not represent the true level value.

The working principle of the gate driving circuit 20 shown in FIG. 9 will be described below with reference to the signal timing diagram in FIG. 10 and the shift register unit 10 shown in FIG. 5.

In the display period DS of the first frame 1F, the working process for the shift register unit 10 of the first stage is described as follows.

In a first stage 1, the first sub-clock signal line CLK_1 provides a high level. Because the shift register unit 10 of the first stage is connected to the first sub-clock signal line CLK_1 to receive the second clock signal CLKB, the second clock signal CLKB received by the shift register unit 10 of the first stage in the first stage 1 is at a high level. As shown in FIG. 5, the sixth transistor M6 is turned on under the control of the second clock signal CLKB at a high level, and the second voltage VDD at a high level charges the second node QB<1> through the sixth transistor M6, thereby pulling up the second node QB<1> to a high level. Because the second node QB<1> is at a high level, the fifteenth transistor M15, the sixteenth transistor M16, and the seventeenth transistor M17 are turned on, so that the first node Q<1>, the shifting signal output terminal CRT, and the driving signal output terminal DST can be reset.

In a second stage 2, the first input signal STU received by the shift register unit 10 of the first stage is at a high level and the fifth transistor M5 is turned on, so that the second voltage VDD at a high level can charge the first node Q<1> through the fifth transistor M5, thereby pulling up the first node Q<1> to a high level. The eighth transistor M8 and the ninth transistor M9 are turned on under the control of the level of the first node Q<1>, but because the third clock signal CLKC provided by the third sub-clock signal line CLK_3 in this case is at a low level, the shifting signal CR<1> and the driving signal OUT<1> output by the shift register unit 10 of the first stage are at a low level. In the second stage 2, the pre-charging operation is completed for the first node in the shift register unit 10 of the first stage.

Meanwhile, in the second stage 2, because the level of the first node Q<1> becomes a high level, the seventh transistor M7 is turned on. In addition, because the first input signal is at a high level, the twelfth transistor M12 is turned on. The first voltage VGL1 at a low level can reset the second node QB<1> through the seventh transistor M7 and the twelfth transistor M12, so that the level of the second node QB<1> is pulled down to the low level. Pulling down the level of the second node QB<1> to a low level can prevent the level of the second node QB<1> from affecting the pre-charge operation of the first node Q<1>.

In a third stage 3, the level of the third clock signal CLKC provided by the third sub-clock signal line CLK_3 becomes a high level, so the levels of the shifting signal CR<1> and the driving signal OUT<1> output by the shift register unit 10 of the first stage become high levels. For example, the shifting signal CR<1> output by the shift register unit 10 of the first stage may be provided to the second shift register unit 10 as the first input signal STU1, and the driving signal OUT<1> output by the shift register unit 10 of the first stage can be provided to the first row of sub-pixel units in the display panel to drive the first row of sub-pixel units to perform a display operation.

In addition, due to the coupling effect of the third capacitor C3, the driving signal OUT<1> output by the shift register unit 10 of the first stage at a high level can couple and pull up the level of the first node Q<1>, thereby further pulling up the level of the first node Q<1>. Compared with the second stage 2, the level of the first node Q<1> is higher in the third stage 3, so that the seventh transistor M7 is turned on more sufficiently, thereby pulling down the level of the second node QB<1> to a lower level.

In a fourth stage 4, because the second shift register unit 10 is connected to the first sub-clock signal line CLK_1 to receive the third clock signal CLKC, the second shift register unit 10 outputs the shifting signal CR at a high level in the fourth stage 4, and the shifting signal CR is provided to the shift register unit 10 of the first stage as the display reset signal STD. Because the display reset signal STD is at a high level, the thirteenth transistor M13 is turned on and thus the first voltage VGL1 at a low level pulls down and resets the first node Q<1> through the thirteenth transistor M13, thereby pulling down the level of the first node Q<1> to a low level.

Because the level of the first node Q<1> is a low level, the seventh transistor M7 is turned off. In this case, because the second clock signal CLKB received by the shift register unit 10 of the first stage in the fourth stage 4 is at a high level, the sixth transistor M6 is turned on, and the second voltage VDD at a high level can charge the second node QB<1>, thereby pulling up the level of the second node QB<1> to a high level. The seventh transistor M7, the sixteenth transistor M16 and the seventeenth transistor M17 are turned on under the control of the level of the second node QB<1>, and the first node Q<1>, the shifting signal output terminal CRT, and the driving signal output terminal DST can be reset, so that the levels of the shifting signal CR<1> and the driving signal OUT<1> output by the shift register unit 10 of the first stage become low levels.

Then, during the remaining part of the display period DS, because the first capacitor C1 can maintain the high level of the second node QB<1>, even if the second clock signal CLKB received by the shift register unit 10 of the first stage becomes a low level, the level of the second node QB<1> will not be affected, so that the level of the second node QB<1> can be prevented from drifting, and the level of the first node Q<1> can be prevented from being pulled up to a high level when the shift register unit 10 does not need to output a driving signal, thereby avoiding the problem that the shift register unit 10 outputs signals multiple times.

The shift register unit 10 of the first stage drives the first row of sub-pixel units in the display panel to complete the display operation, and so on, and the shift register units 10 of the second stage, the third stage and other stages drive the sub-pixel units in the display panel row by row to complete the display drive for one frame. Then, the display period of the first frame ends.

The fourth node H<1> is also charged in the display period DS of the first frame 1F. For example, in the case where the first row of sub-pixel units needs to be compensated for in the first frame 1F, the following operations are also performed in the display period DS of the first frame 1F.

In the third stage 3, the selection control signal OE provided by the seventh sub-clock signal line CLK_7 is at a high level, so the first transistor M1 is turned on. At the same time, the second input signal STU2 received by the shift register unit 10 of the first stage can be the same as the shifting signal CR<1> output by the shift register unit of the first stage, so that the second input signal STU2 at a high level can charge the fourth node H<1>, thereby pulling up the level of the fourth node H<1> to a high level.

It should be noted that the above charging process for the fourth node H<1> is only an example, and the embodiments of the present disclosure include but are not limited thereto. For example, the second input signal STU2 received by the shift register unit 10 of the first stage may also be the same as the shifting signal CR output by the shift register units 10 of other stages, as long as the signal timing of the signal provided to the seventh sub-clock signal line CLK_7 is the same as the signal timing of the second input signal STU2.

The high level of the fourth node H<1> can be maintained until the blanking period BL of the first frame 1F. In the case where the first row of sub-pixel units needs to be compensated for in the first frame 1F, the following operations are performed in the blanking period BL of the first frame 1F.

In the fifth stage 5, the first clock signal CLKA provided by the sixth sub-clock signal line CLK_6 is at a high level. Because the fourth node H<1> remains at a high level in this stage, the second transistor M2 is turned on, and the first clock signal CLKA at a high level is transmitted to the third node N through the second transistor M2, so that the third node N becomes a high level. The fourth transistor M4 is turned on under the control of the third node N, so that the second voltage VDD at a high level can charge the first node Q<1>, thereby pulling up the level of the first node Q<1> to a high level.

Meanwhile, in the fifth stage 5, because the first clock signal CLKA is at a high level and the fourth node H<1> is at a high level, the tenth transistor M10 and the eleventh transistor M11 are turned on, so that the first voltage VGL1 at a low level can reset the second node QB<1>, thereby pulling down the level of the second node QB<1> to a low level.

In the sixth stage 6, the level of the third clock signal CLKC provided by the third sub-clock signal line CLK_3 becomes a high level, so the levels of the shifting signal CR<1> and the driving signal OUT<1> output by the first stage shift register unit 10 become a high level. For example, the driving signal OUT<1> can be used to drive sensing transistors in the first row of sub-pixel units in the display panel to achieve external compensation.

Meanwhile, in the sixth stage 6, due to the coupling effect of the third capacitor C3, the level of the first node Q<1> is pulled up higher.

In the seventh stage 7, due to the maintaining effect of the third capacitor C3, the first node Q<1> is still maintained at a high level, so that the eighth transistor M8 and the ninth transistor M9 remain to be turned on. However, because the level of the third clock signal CLKC provided by the third sub-clock signal line CLK_3 becomes a low level, the levels of the shifting signal CR<1> and the driving signal OUT<1> output by the shift register unit 10 of the first stage become a low level. At the same time, due to the coupling effect of the third capacitor C3, the level of the first node Q<1> will also decrease.

In the eighth stage 8, the fifth sub-clock signal line CLK_5 and the seventh sub-clock signal line CLK_7 provide high levels, and the fourteenth transistor M14 in the shift register unit 10 of each stage in the gate driving circuit 20 is turned on, so that the first node Q in the shift register unit 10 of each stage can be reset; the first transistor M1 in the shift register unit 10 of each stage in the gate driving circuit 20 is turned on, and because the second input signal STU2 received at this time is at a low level, the fourth node H in the shift register unit 10 of each stage can be reset, thereby completing the global reset.

At this point, the driving timing of the first frame ends. For the subsequent driving of the gate driving circuit in the second frame, the third frame, and so on, reference may be made to the above description, which will not be described again.

It should be noted that in the above description of the working principle of random compensation, the description is made by taking the case where the driving signal corresponding to the first row of sub-pixel units of the display panel is output during the blanking period of the first frame as an example, and the disclosure is not limited thereto. For example, in the case where the driving signal corresponding to the n-th row of sub-pixel units of the display panel needs to be output during the blanking period of a frame, the corresponding fourth node H needs to be pulled up to a high level during the display period DS of the frame, and during the blanking period BL of the frame, the first clock signal CLKA at a high level is provided to pull up the level of the first node Q, and then in the case where the driving signal at a high level needs to be output, the third clock signal CLKC at a high level is provided, n is an integer greater than zero.

In addition, in the embodiments of the present disclosure, the timing of the two signals being the same refers to time synchronization of being at a high level, and does not require that the two signals have the same amplitude.

Figure 12:
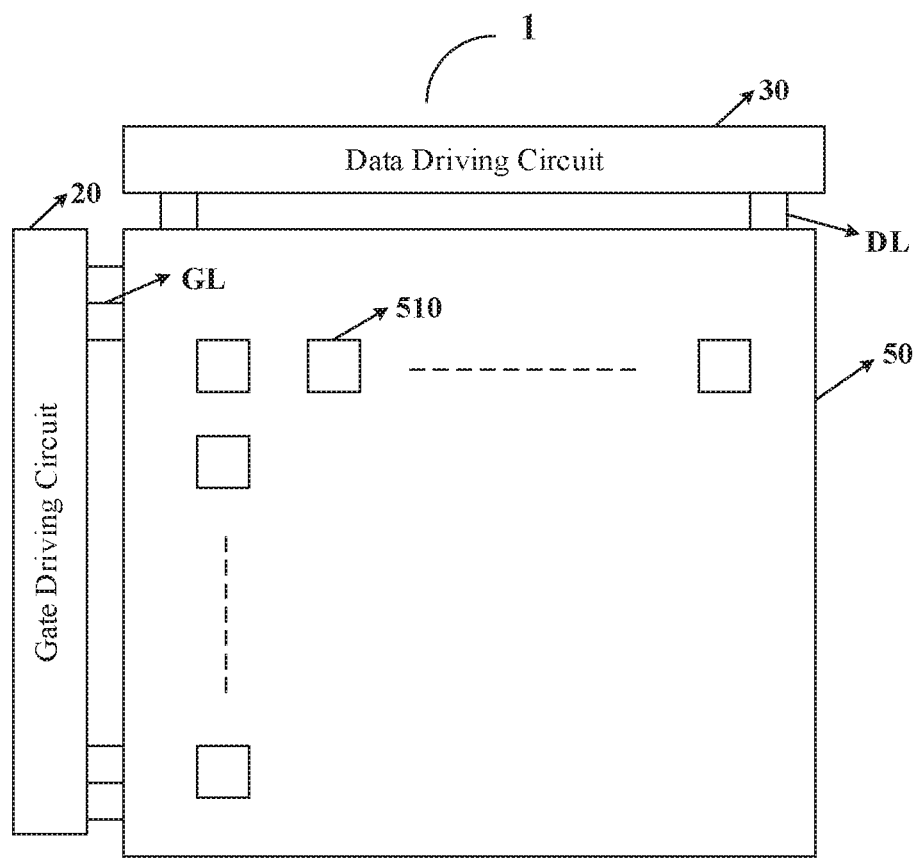
FIG. 12 is a schematic diagram of a display device provided by some embodiments of the present disclosure.

Some embodiments of the present disclosure also provide a display device 1. As shown in FIG. 12, the display device 1 includes a gate driving circuit 20 provided by the embodiments of the present disclosure and a plurality of sub-pixel units 510 arranged in an array. For example, the display device 1 further includes a display panel 50, and a pixel array formed by a plurality of sub-pixel units 510 is provided in the display panel 50.

A driving signal OUT output from each shift register unit 10 in the gate driving circuit 20 is provided to different rows of sub-pixel units 510. For example, the gate driving circuit 20 is electrically connected to the sub-pixel unit 510 through a gate line GL. The gate driving circuit 20 is used to provide the driving signal OUT to the pixel array. For example, the driving signal OUT can be used to drive the scanning transistor and the sensing transistor in the sub-pixel unit 510.

For example, the display device 1 may further include a data driving circuit 30 for providing data signals to the pixel array. For example, the data driving circuit 30 is electrically connected to the sub-pixel unit 510 through a data line DL.

It should be noted that the display device 1 in the present embodiment may be any product or component with a display function such as a liquid crystal panel, an liquid crystal television, a display, an OLED panel, an OLED television, an electronic paper display device, a mobile phone, a tablet computer, a notebook computer, a digital photo frame, a navigator, and the like.

For the technical effect of the display device 1 provided by the embodiment of the present disclosure, reference may be made to the corresponding description about the gate driving circuit 20 in the above-mentioned embodiment, which will not be repeated here.

An embodiment of the present disclosure also provides a driving method, which can be used to drive the shift register unit 10 provided by the embodiments of the present disclosure, a plurality of the shift register units 10 can be cascaded to form the gate driving circuit provided by an embodiment of the present disclosure, and the gate driving circuit is used to drive the display panel to display at least one frame of pictures.

The driving method includes: controlling, by the first input circuit 110, the level of the first node Q in response to the first input signal STU1; providing, by the output circuit 120, the output signal at the output terminal OP under the control of the level of the first node Q; controlling, by the first control circuit 130, the level of the second node QB under the control of the level of the first node Q; resetting, by the first reset circuit 140, the first node Q and the output terminal OP which includes, for example, the shifting signal output terminal CRT and the driving signal output terminal DST, under the control of the level of the second node QB; controlling, by the second input circuit 150, the level of the third node N in response to the selection control signal OE; controlling, by the transmission circuit 160, the level of the first node Q according to the level of the third node N; and stabilizing, by the storage circuit 170, the level of the second node QB.

It should be noted that, for a detailed description and technical effects of the driving method provided by the embodiments of the present disclosure, reference may be made to the description of the working principles of the shift register unit 10 and the gate driving circuit 20 in the embodiments of the present disclosure, which will not be described again.

What are described above is related to the illustrative embodiments of the disclosure only and not imitative to the scope of the disclosure; the scopes of the disclosure are defined by the accompanying claims.

What is claimed is:

1. A shift register unit, comprising a first input circuit, an output circuit, a first control circuit, a first reset circuit, a second input circuit, a transmission circuit, and a storage circuit;
   wherein the first input circuit is configured to control a level of a first node in response to a first input signal,
   the output circuit is configured to provide an output signal at an output terminal under control of the level of the first node,
   the first control circuit is configured to control a level of a second node under control of the level of the first node,
   the first reset circuit is configured to reset the first node and the output terminal under control of the level of the second node,
   the second input circuit is configured to control a level of a third node in response to a selection control signal,
   the transmission circuit is configured to control the level of the first node according to the level of the third node, and the storage circuit is electrically connected to the second node, and is configured to stabilize the level of the second node.

2. The shift register unit according to claim 1, wherein the second input circuit comprises a selection input circuit and a transmission control circuit,
the selection input circuit is configured to control, in response to the selection control signal, a level of a fourth node by using a second input signal; and
the transmission control circuit is connected to the third node and the fourth node, and is configured to transmit a first clock signal to the third node under control of the level of the fourth node.

3. The shift register unit according to claim 2, further comprising a second reset circuit, wherein the second reset circuit is configured to reset the third node under control of the level of the second node.

4. The shift register unit according to claim 3, wherein the second reset circuit is connected to the second node and the third node.

5. The shift register unit according to claim 3, wherein the storage circuit comprises a first capacitor, the selection input circuit comprises a first transistor, the transmission control circuit comprises a second transistor, the second reset circuit comprises a third transistor, and the transmission circuit comprises a fourth transistor;
a first electrode of the first capacitor is connected to the fourth node, and a second electrode of the first capacitor is connected to the second node;
a gate electrode of the first transistor is configured to receive the selection control signal, a first electrode of the first transistor is configured to receive the second input signal, and a second electrode of the first transistor is connected to the fourth node;
a gate electrode of the second transistor is connected to the fourth node, a first electrode of the second transistor is configured to receive the first clock signal, and a second electrode of the second transistor is connected to the third node;
a gate electrode of the third transistor is connected to the second node, a first electrode of the third transistor is connected to the third node, and a second electrode of the third transistor is configured to receive a first voltage; and
a gate electrode of the fourth transistor is connected to the third node, a first electrode of the fourth transistor is configured to receive the first clock signal or a second voltage, and a second electrode of the fourth transistor is connected to the first node.

6. The shift register unit according to claim 3, wherein the storage circuit comprises a second capacitor, the selection input circuit comprises a first transistor and a first capacitor, the transmission control circuit comprises a second transistor, the second reset circuit comprises a third transistor, and the transmission circuit comprises a fourth transistor;
a first electrode of the second capacitor is connected to the second node, and a second electrode of the second capacitor is configured to receive a fixed level;
a gate electrode of the first transistor is configured to receive the selection control signal, a first electrode of the first transistor is configured to receive the second input signal, and a second electrode of the first transistor is connected to the fourth node;
a first electrode of the first capacitor is connected to the fourth node, and a second electrode of the first capacitor is connected to the third node;
a gate electrode of the second transistor is connected to the fourth node, a first electrode of the second transistor is configured to receive the first clock signal, and a second electrode of the second transistor is connected to the third node;
a gate electrode of the third transistor is connected to the second node, a first electrode of the third transistor is connected to the third node, and a second electrode of the third transistor is configured to receive a first voltage; and
a gate electrode of the fourth transistor is connected to the third node, a first electrode of the fourth transistor is configured to receive the first clock signal or a second voltage, and a second electrode of the fourth transistor is connected to the first node.

7. The shift register unit according to claim 3, wherein the storage circuit comprises a first capacitor, the selection input circuit comprises a first transistor, and the transmission control circuit comprises a second transistor, and the transmission circuit comprises a fourth transistor;
a first electrode of the first capacitor is connected to the fourth node, and a second electrode of the first capacitor is connected to the second node;
a gate electrode of the first transistor is configured to receive the selection control signal, a first electrode of the first transistor is configured to receive the second input signal, and a second electrode of the first transistor is connected to the fourth node;
a gate electrode of the second transistor is connected to the fourth node, a first electrode of the second transistor is configured to receive the first clock signal, and a second electrode of the second transistor is connected to the third node; and
a gate electrode of the fourth transistor is configured to receive the first clock signal, a first electrode of the fourth transistor is connected to the third node, and a second electrode of the fourth transistor is connected to the first node.

8. The shift register unit according to claim 2, wherein the storage circuit comprises a first capacitor, the selection input circuit comprises a first transistor, and the transmission control circuit comprises a second transistor, and the transmission circuit comprises a fourth transistor;
a first electrode of the first capacitor is connected to the fourth node, and a second electrode of the first capacitor is connected to the second node;
a gate electrode of the first transistor is configured to receive the selection control signal, a first electrode of the first transistor is configured to receive the second input signal, and a second electrode of the first transistor is connected to the fourth node;
a gate electrode of the second transistor is connected to the fourth node, a first electrode of the second transistor is configured to receive the first clock signal, and a second electrode of the second transistor is connected to the third node; and
a gate electrode of the fourth transistor is configured to receive the first clock signal, a first electrode of the fourth transistor is connected to the third node, and a second electrode of the fourth transistor is connected to the first node.

9. The shift register unit according to claim 2, further comprising a second control circuit, wherein the second control circuit is configured to control the level of the second node under control of the first clock signal and the level of the fourth node.

10. The shift register unit according to claim 9, wherein the second control circuit comprises a tenth transistor and an eleventh transistor,
  a gate electrode of the tenth transistor is configured to receive the first clock signal, a first electrode of the tenth transistor is connected to the second node, and a second electrode of the tenth transistor is connected to a first electrode of the eleventh transistor,
  a gate electrode of the eleventh transistor is connected to the fourth node, and a second electrode of the eleventh transistor is configured to receive a first voltage.

11. The shift register unit according to claim 1,
  wherein the first control circuit is further configured to transmit a second voltage to the second node under control of a second clock signal;
  the output circuit is further configured to receive a third clock signal and provide the third clock signal to the output terminal as the output signal under control of the level of the first node;
  both the second clock signal and the third clock signal are pulse signals with a duty ratio of one third, the third clock signal and the second clock signal are separated in timing by a first time interval, and the first time interval is equal to two thirds of a period of the pulse signal.

12. The shift register unit according to claim 11, wherein the first input circuit comprises a fifth transistor, the first control circuit comprises a sixth transistor and a seventh transistor, the output circuit comprises an eighth transistor, a ninth transistor, and a third capacitor, the output terminal comprises a shifting signal output terminal and a driving signal output terminal, and the shifting signal output terminal and the driving signal output terminal are configured to output the output signal;
  a gate electrode of the fifth transistor is configured to receive the first input signal, a first electrode of the fifth transistor is configured to receive the first input signal or the second voltage, and a second electrode of the fifth transistor is connected to the first node;
  a gate electrode of the sixth transistor is configured to receive the second clock signal, a first electrode of the sixth transistor is configured to receive the second voltage, and a second electrode of the sixth transistor is connected to the second node;
  a gate electrode of the seventh transistor is connected to the first node, a first electrode of the seventh transistor is connected to the second node, and a second electrode of the seventh transistor is configured to receive a first voltage;
  a gate electrode of the eighth transistor is connected to the first node, a first electrode of the eighth transistor is configured to receive the third clock signal, and a second electrode of the eighth transistor is connected to the shifting signal output terminal;
  a gate electrode of the ninth transistor is connected to the first node, a first electrode of the ninth transistor is configured to receive the third clock signal, and a second electrode of the ninth transistor is connected to the driving signal output terminal; and
  a first electrode of the third capacitor is connected to the first node, and a second electrode of the third capacitor is connected to the driving signal output terminal.

13. The shift register unit according to claim 1, further comprising a third control circuit, wherein the third control circuit is configured to control the level of the second node in response to the first input signal.

14. The shift register unit according to claim 13, wherein the third control circuit comprises a twelfth transistor,
  a gate electrode of the twelfth transistor is configured to receive the first input signal, a first electrode of the twelfth transistor is connected to the second node, and a second electrode of the twelfth transistor is configured to receive a first voltage.

15. The shift register unit according to claim 1, further comprising a third reset circuit and a fourth reset circuit, wherein the third reset circuit is configured to reset the first node in response to a display reset signal, and the fourth reset circuit is configured to reset the first node in response to a global reset signal.

16. The shift register unit according to claim 15, wherein the third reset circuit comprises a thirteenth transistor, and the fourth reset circuit comprises a fourteenth transistor;
  a gate electrode of the thirteenth transistor is configured to receive the display reset signal, a first electrode of the thirteenth transistor is connected to the first node, and a second electrode of the thirteenth transistor is configured to receive a first voltage; and
  a gate electrode of the fourteenth transistor is configured to receive the global reset signal, a first electrode of the fourteenth transistor is connected to the first node, and a second electrode of the fourteenth transistor is configured to receive the first voltage.

17. A gate driving circuit, comprising a plurality of shift register units which are cascaded, wherein the shift register unit comprises a first input circuit, an output circuit, a first control circuit, a first reset circuit, a second input circuit, a transmission circuit, and a storage circuit;
  the first input circuit is configured to control a level of a first node in response to a first input signal,
  the output circuit is configured to provide an output signal at an output terminal under control of the level of the first node,
  the first control circuit is configured to control a level of a second node under control of the level of the first node,
  the first reset circuit is configured to reset the first node and the output terminal under control of the level of the second node,
  the second input circuit is configured to control a level of a third node in response to a selection control signal,
  the transmission circuit is configured to control the level of the first node according to the level of the third node, and
  the storage circuit is electrically connected to the second node, and is configured to stabilize the level of the second node.

18. The gate driving circuit according to claim 17, further comprising a first sub-clock signal line, a second sub-clock signal line, and a third sub-clock signal line;
  wherein a shift register unit of a (3n−2)-th stage is connected to the first sub-clock signal line to receive a second clock signal for the shift register unit of the (3n−2)-th stage, and the shift register unit of the (3n−2)-th stage is connected to the third sub-clock signal line to receive a third clock signal for the shift register unit of the (3n−2)-th stage;
  a shift register unit of a (3n−1)-th stage is connected to the second sub-clock signal line to receive a second clock signal for the shift register unit of the (3n−1)-th stage, and the shift register unit of the (3n−1)-th stage is connected to the first sub-clock signal line to receive a third clock signal for the shift register unit of the (3n−1)-th stage;

a shift register unit of a (3n)-th stage is connected to the third sub-clock signal line to receive a second clock signal for the shift register unit of the (3n)-th stage, and the shift register unit of the (3n)-th stage is connected to the second sub-clock signal line receive a third clock signal for the shift register unit of the (3n)-th stage; and n is an integer greater than 0.

19. A display device, comprising the gate driving circuit according to claim 17.

20. A method of driving a shift register unit,
wherein the shift register unit comprises a first input circuit, an output circuit, a first control circuit, a first reset circuit, a second input circuit, a transmission circuit, and a storage circuit;
the first input circuit is configured to control a level of a first node in response to a first input signal,
the output circuit is configured to provide an output signal at an output terminal under control of the level of the first node,
the first control circuit is configured to control a level of a second node under control of the level of the first node,
the first reset circuit is configured to reset the first node and the output terminal under control of the level of the second node,
the second input circuit is configured to control a level of a third node in response to a selection control signal,
the transmission circuit is configured to control the level of the first node according to the level of the third node,
the storage circuit is electrically connected to the second node, and is configured to stabilize the level of the second node,
the method comprises:
controlling, by the first input circuit, the level of the first node in response to the first input signal;
providing, by the output circuit, the output signal at the output terminal under the control of the level of the first node;
controlling, by the first control circuit, the level of the second node under the control of the level of the first node;
resetting, by the first reset circuit, the first node and the output terminal under the control of the level of the second node;
controlling, by the second input circuit, the level of the third node in response to the selection control signal;
controlling, by the transmission circuit, the level of the first node according to the level of the third node; and
stabilizing, by the storage circuit, the level of the second node.

* * * * *